United States Patent
Kamata

(10) Patent No.: US 8,416,622 B2
(45) Date of Patent: Apr. 9, 2013

(54) DRIVING METHOD OF A SEMICONDUCTOR DEVICE WITH AN INVERTED PERIOD HAVING A NEGATIVE POTENTIAL APPLIED TO A GATE OF AN OXIDE SEMICONDUCTOR TRANSISTOR

(75) Inventor: Koichiro Kamata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 147 days.

(21) Appl. No.: 13/108,252

(22) Filed: May 16, 2011

(65) Prior Publication Data

US 2011/0286290 A1 Nov. 24, 2011

(30) Foreign Application Priority Data

May 20, 2010 (JP) ................................ 2010-115852

(51) Int. Cl.
*G11C 16/04* (2006.01)
(52) U.S. Cl. .......... 365/185.18; 365/185.03; 365/185.05
(58) Field of Classification Search ............. 365/185.03, 365/185.08, 185.05, 185.19, 185.18
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,412,608 A * | 5/1995 | Oyama | 365/218 |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Andrew Q Tran
(74) *Attorney, Agent, or Firm* — Fish & Richardson P.C.

(57) ABSTRACT

A period (inverted period) in which a high negative potential is applied to a gate of the transistor is provided between a writing period and a retention period. In the inverted period, supply of positive electric charge from the drain of the transistor to the oxide semiconductor layer is promoted. Thus, accumulation of positive electric charge in the oxide semiconductor layer or at the interface between the oxide semiconductor layer and a gate insulating film can converge in a short time. Therefore, it is possible to suppress a decrease in the positive electric charge in the node electrically connected to the drain of the transistor in the retention period after the inverted period. That is, the temporal change of data stored in the semiconductor device can be suppressed.

8 Claims, 13 Drawing Sheets

U.S. PATENT DOCUMENTS

| | | |
|---|---|---|
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0148845 A1 | 6/2010 | Kato |
| 2010/0193785 A1 | 8/2010 | Kimura |
| 2011/0101351 A1 | 5/2011 | Yamazaki |
| 2011/0121878 A1 | 5/2011 | Kato et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0148463 A1 | 6/2011 | Kato et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176354 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0194327 A1 | 8/2011 | Kawae |
| 2011/0194331 A1 | 8/2011 | Kawae et al. |
| 2011/0194332 A1 | 8/2011 | Saito |
| 2011/0198593 A1 | 8/2011 | Kato et al. |
| 2011/0199807 A1 | 8/2011 | Saito et al. |
| 2011/0199816 A1 | 8/2011 | Inoue et al. |
| 2011/0204365 A1 | 8/2011 | Saito |
| 2011/0205774 A1 | 8/2011 | Takemura |
| 2011/0205785 A1 | 8/2011 | Nagatsuka et al. |
| 2011/0210339 A1 | 9/2011 | Yamazaki et al. |
| 2011/0215317 A1 | 9/2011 | Yamazaki et al. |
| 2011/0216571 A1 | 9/2011 | Yamazaki et al. |
| 2011/0220891 A1 | 9/2011 | Fujii et al. |
| 2011/0227062 A1 | 9/2011 | Kato et al. |
| 2011/0227072 A1 | 9/2011 | Inoue et al. |
| 2011/0227074 A1 | 9/2011 | Kato et al. |
| 2011/0228584 A1 | 9/2011 | Takemura |
| 2011/0228602 A1 | 9/2011 | Saito et al. |
| 2011/0249484 A1 | 10/2011 | Takemura |
| 2011/0255325 A1 | 10/2011 | Nagatsuka et al. |
| 2011/0260158 A1 | 10/2011 | Takemura |
| 2011/0278571 A1 | 11/2011 | Yamazaki et al. |
| 2011/0280061 A1 | 11/2011 | Saito et al. |
| 2011/0284838 A1 | 11/2011 | Saito |
| 2012/0074407 A1 | 3/2012 | Yamazaki et al. |

FOREIGN PATENT DOCUMENTS

| | | | |
|---|---|---|---|
| JP | 57-105889 A | | 7/1982 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 05-251705 A | | 9/1993 |
| JP | 08-264794 A | | 10/1996 |
| JP | 11-505377 A | | 5/1999 |
| JP | 2000-044236 A | | 2/2000 |
| JP | 2000-150900 A | | 5/2000 |
| JP | 2002-076356 A | | 3/2002 |

| | | |
|---|---|---|
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Kim, W et al., "An Experimental High-Density DRAM Cell with a Built-in Gain Stage," IEEE Journal of Solid State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000°C," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$—$Ga_2ZNO_4$—ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTS With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED." AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

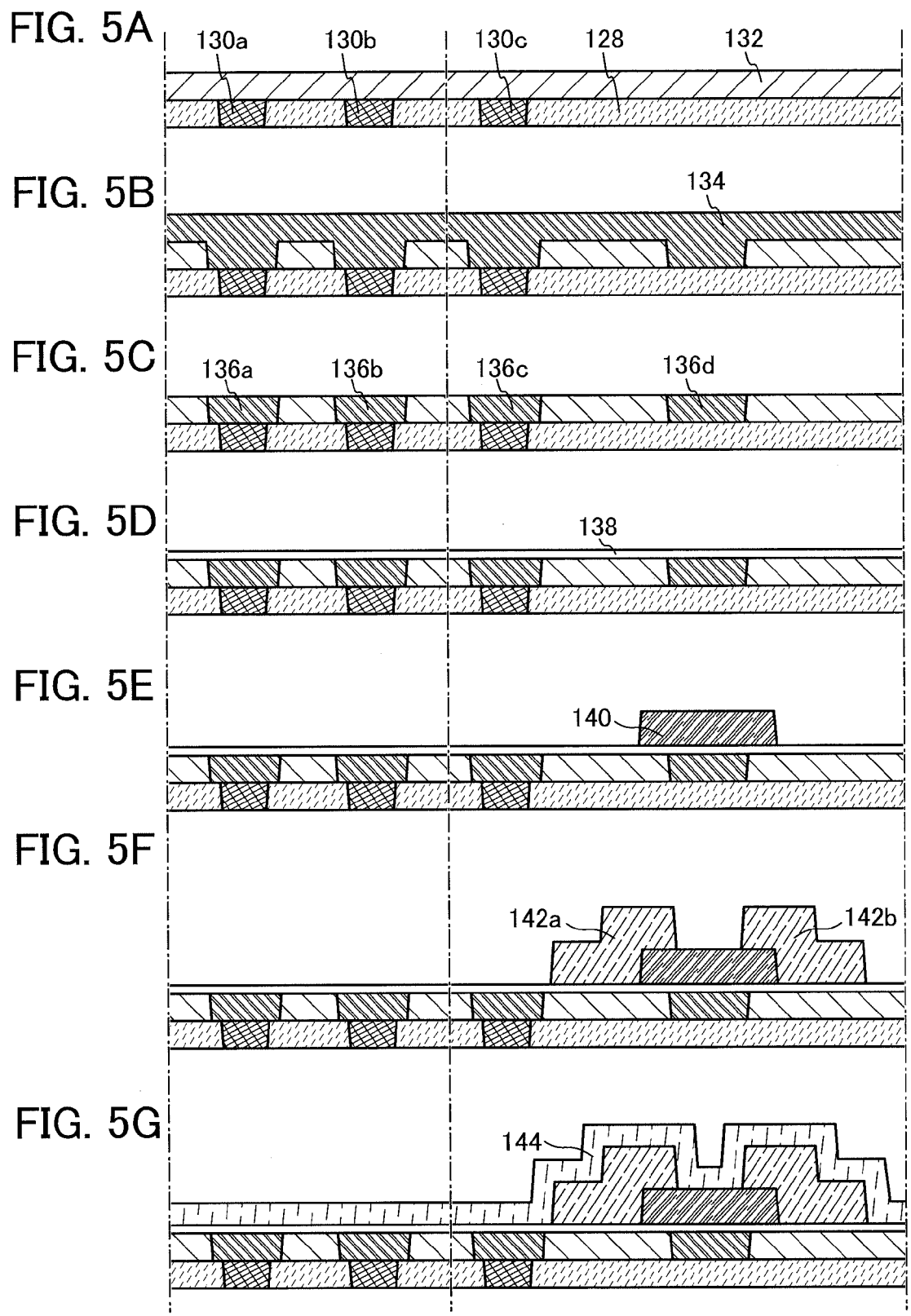

DRIVING METHOD OF A SEMICONDUCTOR DEVICE WITH AN INVERTED PERIOD HAVING A NEGATIVE POTENTIAL APPLIED TO A GATE OF AN OXIDE SEMICONDUCTOR TRANSISTOR

BACKGROUND OF THE INVENTION

1. Field of the Invention

The present invention relates to a driving method of a semiconductor device having transistors. Note that the semiconductor device in this specification indicates all the devices that operate by utilizing semiconductor characteristics.

2. Description of the Related Art

Storage devices using semiconductor elements are broadly classified into two categories: a volatile device that loses stored data when power supply stops, and a non-volatile device that retains stored data even when power is not supplied.

A typical example of a volatile storage device is a dynamic random access memory (DRAM). A DRAM stores data in such a manner that a transistor included in a storage element is selected and electric charge is accumulated in a capacitor.

When data is read from a DRAM, electric charge in a capacitor is lost on the above-described principle; thus, another writing operation is necessary every time data is read. Moreover, a transistor included in a storage element has leakage current and electric charge flows into or out of a capacitor even when the transistor is not selected, so that the data retention time is short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to retain the data for a long time.

Another example of a volatile storage device is a static random access memory (SRAM). An SRAM retains stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate and a channel formation region in a transistor and stores data by retaining electric charge in the floating gate. Therefore, a flash memory has advantages in that the data retention time is extremely long (almost permanent) and refresh operation which is necessary in a volatile storage device is not needed (e.g., see Patent Document 1).

However, a gate insulating film included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary for retaining electric charge in the floating gate or removing the electric charge, and a circuit for generating high voltage is also necessary. Further, it takes a relatively long time to retain or remove electric charge, and it is not easy to perform writing and erasing at higher speed.

REFERENCE

Patent Document 1: Japanese Published Patent Application No. S57-105889

SUMMARY OF THE INVENTION

In view of the aforementioned problems, a semiconductor device with a new structure, which can retain stored data even when power is not supplied and which has no limitation on the number of writing operations has been developed. The semiconductor device utilizes a transistor whose channel region is included in an oxide semiconductor layer and which can remarkably reduce a current value in an off state. Specifically, in the semiconductor device, electric charge is retained in a node electrically connected to one of a source and a drain of the transistor. When the transistor is turned off, the electric charge stored in the node of the semiconductor device can be retained for a long time.

Current (transient current) is generated in a gate of the transistor whose channel region is included in an oxide semiconductor layer even after the gate is electrically connected to a wiring which supplies a fixed potential, in some cases. Specifically, in a state in which voltage of less than threshold voltage of the transistor is applied between the gate and the source of the transistor and a potential applied to the drain is higher than a potential applied to the gate, transient current sometimes is generated in the gate. That is, in a state in which the transistor is in an off state (a state in which a channel region is not formed) and an electric field is generated from the drain to the gate of the transistor, transient current is generated in the gate in some cases. Note that a value of the transient current decreases with time.

It is thought that the transient current is attributed to the fact that positive electric charge is supplied from the drain of the transistor to the oxide semiconductor layer and the positive electric charge is accumulated in the oxide semiconductor layer or at the interface between the oxide semiconductor layer and a gate insulating film. That is, under the above conditions, positive electric charge is accumulated in the oxide semiconductor layer or at the interface between the oxide semiconductor layer and the gate insulating film, and negative electric charge is accumulated at the interface between the gate and the gate insulating film (positive electric charge is accumulated on one side and negative electric charge is accumulated on the other side with the gate insulating film provided between the one side and the other side). Therefore, it is thought that transient current is generated even after the gate is electrically connected to the wiring which supplies a fixed potential.

The semiconductor device retains electric charge in a node electrically connected to one of a source and a drain of the transistor whose channel region is included in an oxide semiconductor layer. Therefore, in the case where positive electric charge is retained in the node, the amount of positive electric charge decreases with time in a period in which the transistor is in an off state (retention period). Thus, data stored in the semiconductor device may change with time.

In view of the foregoing problems, an object of one embodiment of the present invention is to suppress the temporal change of data stored in a semiconductor device.

The semiconductor device is driven so as not to decrease the positive electric charge retained in the semiconductor device with time in a long time but so as to decrease the positive electric charge and converge in a short time, whereby the above problem can be solved. Specifically, the above problem can be solved in such a way that a negative potential is temporarily applied to the gate of the transistor whose channel region is included in an oxide semiconductor layer after data writing.

That is, one embodiment of the present invention is a driving method of a semiconductor device. The semiconductor device retains electric charge in a node electrically connected to one of a source and a drain of a transistor whose channel region is included in an oxide semiconductor layer. The driving method includes the following steps. In a writing period, a first potential is applied to a gate of the transistor, the transistor is turned on, and positive electric charge is accumulated in the node through the transistor. In an inverted period following the writing period, a second potential that is a negative potential is applied to the gate of the transistor, and the transistor is turned off. In a retention period following the inverted period, a third potential that is lower than the first potential and higher than the second potential is applied to the gate of the transistor, an off state of the transistor is maintained, and positive electric charge accumulated in the node is retained.

A driving method of a semiconductor device according to one embodiment of the present invention includes a period (inverted period) in which a negative potential is applied to a gate of a transistor between a writing period and a retention period. In the inverted period, supply of positive electric charge from the drain of the transistor to an oxide semiconductor layer is promoted. Thus, accumulation of positive electric charge in the oxide semiconductor layer or at the interface between the oxide semiconductor layer and a gate insulating film can converge in a short time. Therefore, it is possible to suppress a decrease in the positive electric charge in the node electrically connected to the drain of the transistor in the retention period after the inverted period. That is, the temporal change of data stored in the semiconductor device can be suppressed.

BRIEF DESCRIPTION OF THE DRAWINGS

FIGS. 5A to 5G illustrate an example of steps for fabricating a transistor.

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments and the example below.

Embodiment 1

In this embodiment, an example of a semiconductor device which stores data by retaining electric charge in a node electrically connected to one of a source and a drain of a transistor whose channel region is included in an oxide semiconductor layer, and an example of a driving method of the semiconductor device will be described with reference to FIGS. 1A and 1B.

Example of Configuration

Figure 1A:
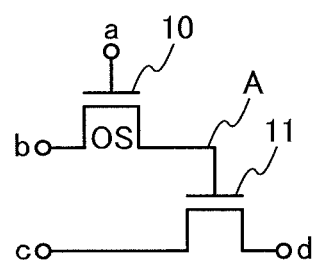
FIG. 1A is a circuit diagram of an example of a configuration of a semiconductor device.

FIG. 1A is a circuit diagram of an example of a configuration of the semiconductor device according to this embodiment. The semiconductor device illustrated in FIG. 1A includes a transistor 10 and a transistor 11. A gate of the transistor 10 is electrically connected to a terminal a, and one of a source and a drain of the transistor 10 is electrically connected to a terminal b. A gate of the transistor 11 is electrically connected to the other of the source and the drain of the transistor 10, one of a source and a drain of the transistor 11 is electrically connected to a terminal c, and the other of the source and the drain of the transistor 11 is electrically connected to a terminal d. Note that the transistor 10 is a transistor whose channel region is included in an oxide semiconductor (OS) layer. In addition, there is no particular limitation on a semiconductor material included in a channel region of the transistor 11. For example, in the case where the transistor 11 is a transistor whose channel region is included in an oxide semiconductor layer, like the transistor 10, the production cost can be reduced and the yield can be improved. In addition, in the case where a transistor whose channel region includes single crystal silicon, polycrystalline silicon, or the like is used as the transistor 11, mobility of the transistor 11 is improved, whereby the semiconductor device can be operated at high speed.

The semiconductor device illustrated in FIG. 1A can control switching of the transistor 11 in accordance with electric charge retained in a node (node A in FIG. 1A) which is electrically connected to the other of the source and the drain of the transistor 10 and the gate of the transistor 11. That is, in the semiconductor device illustrated in FIG. 1A, a state of the transistor 11 is determined, whereby binary data can be obtained. For example, a voltage divider circuit is formed using the transistor 11, and an output signal of the voltage divider circuit is determined, whereby binary data can be obtained.

Example of Driving Method

Figure 1B:
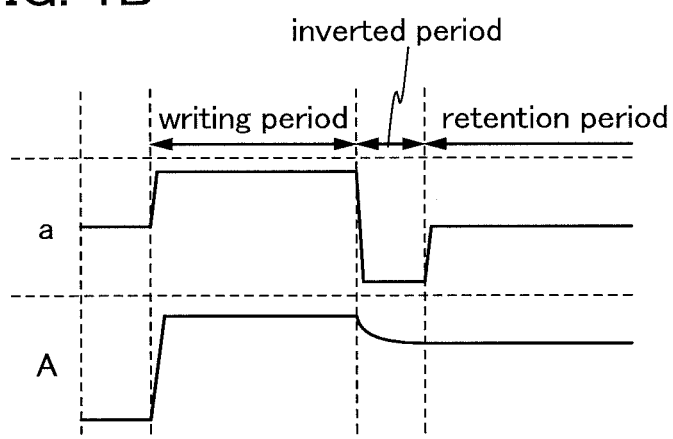
FIG. 1B illustrates an example of a driving method of the semiconductor device.

FIG. 1B illustrates an example of a driving method of the semiconductor device illustrated in FIG. 1A. Note that FIG.

1B illustrates changes of potentials of the terminal a and the node A when positive electric charge supplied from the terminal b through the transistor 10 is accumulated in the node A.

Specifically, in a writing period, a potential of the terminal a is increased to a first potential which is a positive potential. Thus, the transistor 10 is turned on, and the positive electric charge is supplied from the terminal b to the node A, whereby a potential of the node A is increased. Next, in an inverted period, the potential of the terminal a is decreased to a second potential which is a negative potential. Accordingly, the transistor 10 is turned off, and the node A is in a floating state. In addition, because the second potential is applied to the gate of the transistor 10, an intense electric field is generated from the other of the source and the drain of the transistor 10 to the gate thereof. Therefore, trapping of the positive electric charge accumulated in the node A is promoted in the oxide semiconductor layer or at the interface between the oxide semiconductor layer and a gate insulating film, whereby the potential of the node A is reduced. Next, in a retention period, the potential of the terminal a is increased to a third potential which is lower than the first potential and higher than the second potential. Note that the third potential is used to maintain the off state of the transistor 10.

Note that even in the case where the inverted period is not provided in the driving method in FIG. 1B, an electric field is generated from the other of the source and the drain of the transistor 10 to the gate thereof in the retention period. Therefore, in the retention period, trapping of the positive electric charge accumulated in the node A occurs in the oxide semiconductor layer or at the interface between the oxide semiconductor layer and the gate insulating film. In that case, the positive electric charge accumulated in the node A (decrease in the potential of the node A) is decreased for a long time. In contrast, in the driving method of the semiconductor device illustrated in FIG. 1B, the inverted period is provided between the writing period and the retention period. The inverted period is a period in which an electric field from the other of the source and the drain of the transistor 10 to the gate thereof is intentionally strengthened. Accordingly, the decrease of the positive electric charge accumulated in the node A (decrease in the potential of the node A) can converge in a short time. As a result, the temporal change of data in the retention period can be suppressed.

Note that this embodiment or part of this embodiment can be freely combined with the other embodiments or part of the other embodiments.

Embodiment 2

In this embodiment, specific examples of the semiconductor devices described in Embodiment 1 will be described with reference to FIGS. 2A to 2D.

Specific Example 1

Figure 2A:
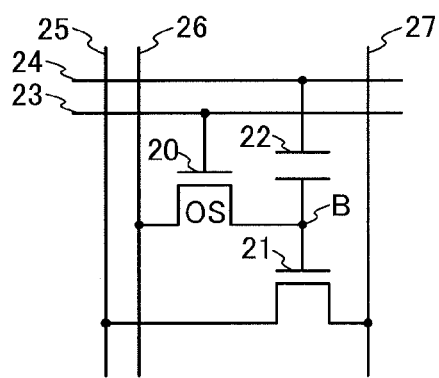
FIGS. 2A and 2C are each a circuit diagram of a specific example of a semiconductor device, and FIGS. 2B and 2D each illustrate an example of a driving method of the semiconductor device.

FIG. 2A is a circuit diagram of a specific example of the semiconductor device described in Embodiment 1. The semiconductor device illustrated in FIG. 2A includes a transistor 20, a transistor 21, and a capacitor 22. A gate of the transistor 20 is electrically connected to a writing word line 23, and one of a source and a drain of the transistor 20 is electrically connected to a writing bit line 26. A gate of the transistor 21 is electrically connected to the other of the source and the drain of the transistor 20, one of a source and a drain of the transistor 21 is electrically connected to a reading bit line 25, and the other of the source and the drain of the transistor 21 is electrically connected to a fixed potential line 27. One electrode of the capacitor 22 is electrically connected to the other of the source and the drain of the transistor 20 and the gate of the transistor 21, and the other electrode of the capacitor 22 is electrically connected to a reading word line 24. Note that the transistor 20 is a transistor whose channel region is included in an oxide semiconductor (OS) layer. Further, there is no particular limitation on a semiconductor material included in a channel region of the transistor 21.

The semiconductor device illustrated in FIG. 2A can control switching of the transistor 21 in accordance with electric charge retained in a node (node B in FIG. 2A) which is electrically connected to the other of the source and the drain of the transistor 20, the gate of the transistor 21, and the one electrode of the capacitor 22. In addition, a potential of the node B can be controlled by capacitive coupling with the reading word line 24. Therefore, in the semiconductor device illustrated in FIG. 2A, multilevel data can be stored. That is, a state (an on state or an off state) of the transistor 21 is determined under a plurality of conditions in which potentials of the reading word line 24 are different from each other, whereby reading can be performed even when the potential of the node B is a multivalued potential. Note that the reading can be performed by, for example, determining an output signal of a voltage divider circuit including the transistor 21. In addition, the semiconductor device illustrated in FIG. 2A can be used as a storage element which retains binary data.

Figure 2B:
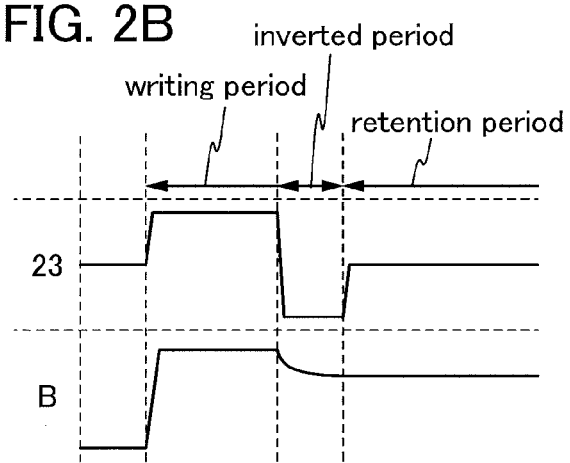

FIG. 2B illustrates an example of a driving method of the semiconductor device illustrated in FIG. 2A. Note that FIG. 2B illustrates changes of the potentials of the writing word line 23 and the node B when positive electric charge supplied from the writing bit line 26 through the transistor 20 is accumulated in the node B.

Specifically, in the writing period, a potential of the writing word line 23 is increased to a first potential which is a positive potential. Thus, the transistor 20 is turned on, and the positive electric charge is supplied from the writing bit line 26 to the node B, whereby the potential of the node B is increased. Next, in the inverted period, the potential of the writing word line 23 is decreased to a second potential which is a negative potential. Accordingly, the transistor 20 is turned off, and the node B is in a floating state. In addition, because the second potential is applied to the gate of the transistor 20, an intense electric field is generated from the other of the source and the drain of the transistor 20 to the gate thereof. Therefore, trapping of the positive electric charge accumulated in the node B is promoted in the oxide semiconductor layer or at the interface between the oxide semiconductor layer and the gate insulating film, whereby the potential of the node B is reduced. Next, in the retention period, the potential of the writing word line 23 is increased to a third potential which is lower than the first potential and higher than the second potential. Note that the third potential is used to maintain the off state of the transistor 20.

Specific Example 2

Figure 2C:
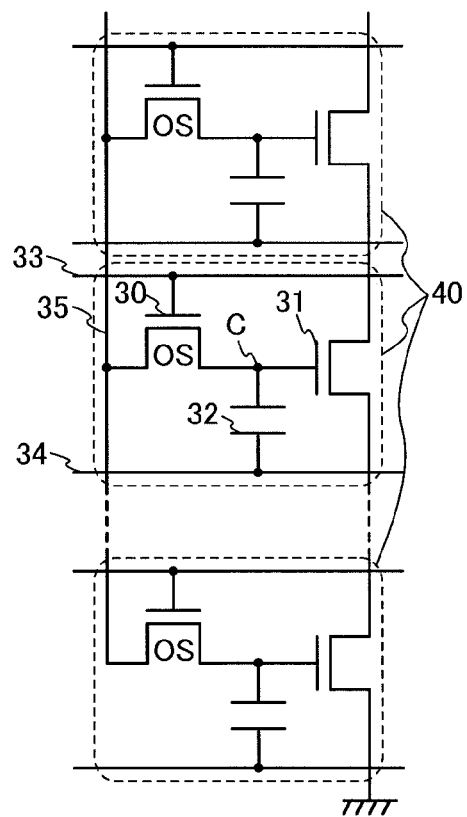

FIG. 2C is a circuit diagram illustrating a specific example of a semiconductor device which is different from that in FIG. 2A. The semiconductor device illustrated in FIG. 2C includes n (n is a natural number of 3 or more) storage elements 40 arranged in a line. Each of the plurality of storage elements 40 includes a transistor 30, a transistor 31, and a capacitor 32. A gate of the transistor 30 is electrically connected to a writing word line 33, and one of a source and a drain of the transistor 30 is electrically connected to a bit line 35. A gate of the transistor 31 is electrically connected to the other of the source and the drain of the transistor 30. One electrode of the capacitor 32 is electrically connected to the other of the source and the drain of the transistor 30 and the gate of the transistor 31, and the other electrode of the capacitor 32 is electrically connected to a reading word line 34. In addition, one of the source and the drain of the transistor 31 included in the k-th (k is a natural number greater than or equal to 2 and less than n) storage element 40 is electrically connected to the other of the source and the drain of the transistor 31 included in the (k−1)-th storage element 40, and the other of the source and the drain of the transistor 31 included in the k-th storage element 40 is electrically connected to one of the source and the drain of the transistor 31 included in the (k+1)-th storage element 40. Note that one of the source and the drain of the transistor 31 included in the first storage element 40 functions as an output terminal. In addition, the other of the source and the drain of the transistor 31 included in the n-th storage element 40 is grounded. Note that the transistor 30 included in each of the plurality of storage elements 40 is a transistor whose channel region is included in an oxide semiconductor (OS) layer. Further, there is no particular limitation on a semiconductor material included in a channel region of the transistor 31 which is included in each of the plurality of storage elements 40.

The semiconductor device illustrated in FIG. 2C can control switching of the transistor 31 in accordance with electric charge retained in a node (node C in FIG. 2C) which is electrically connected to the other of the source and the drain of the transistor 30, the gate of the transistor 31, and the one electrode of the capacitor 32. In addition, a potential of the node C can be controlled by capacitive coupling with the reading word line 34. Note that in the semiconductor device illustrated in FIG. 2C, when data retained in any one of the n storage elements 40 arranged in a line is read, potentials of the reading word lines 34 of the (n−1) storage elements 40 except the storage element 40 are increased to a high level potential. Thus, the transistors 31 included in the (n−1) storage elements 40 except the storage element 40 are turned on. Therefore, the one of the source and the drain of the transistor 31 included in the storage element 40 is electrically connected to the output terminal, and the other of the source and the drain of the transistor 31 in the storage element 40 is grounded. Here, a state (an on state or an off state) of the transistor 31 included in the storage element 40 is determined, whereby binary data can be obtained. Specifically, a voltage divider circuit is formed using the transistor 31 included in the storage element 40, and for example, an output signal of the voltage divider circuit is determined, whereby binary data can be obtained. Note that in all the storage elements 40 illustrated in FIG. 2C, multilevel data can be stored. That is, the state (an on state or an off state) of the transistor 31 is determined under a plurality of conditions in which potentials of the reading word line 34 are different from each other, whereby reading can be performed even when the potential of the node C is a multivalued potential.

Figure 2D:
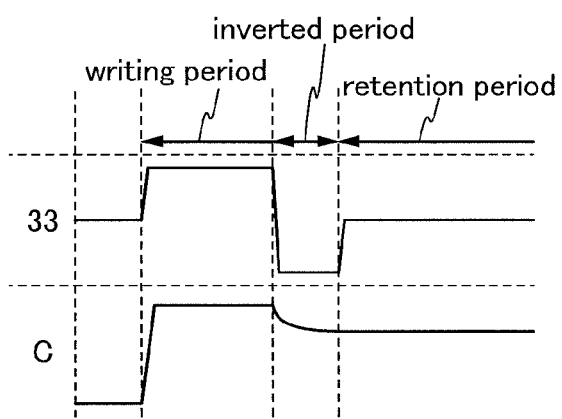

FIG. 2D illustrates an example of a driving method of the semiconductor device illustrated in FIG. 2C. Note that FIG. 2D illustrates changes of potentials of the writing word line 33 and the node C when the positive electric charge supplied from the bit line 35 through the transistor 30 is accumulated in the node C.

Specifically, in the writing period, the potential of the writing word line 33 is increased to the first potential which is a positive potential. Accordingly, the transistor 30 is turned on, and the positive electric charge is supplied from the bit line 35 to the node C, whereby the potential of the node C is increased. Next, in the inverted period, the potential of the writing word line 33 is decreased to the second potential which is a negative potential. Therefore, the transistor 30 is turned off, and the node C is in a floating state. In addition, because the second potential is applied to the gate of the transistor 30, an intense electric field is generated from the other of the source and the drain of the transistor 30 to the gate thereof. Therefore, trapping of the positive electric charge accumulated in the node C is promoted in the oxide semiconductor layer or at the interface between the oxide semiconductor layer and the gate insulating film, whereby the potential of the node C is reduced. Next, in the retention period, the potential of the writing word line 33 is increased to the third potential which is lower than the first potential and higher than the second potential. Note that the third potential is used to maintain the off state of the transistor 30.

In the semiconductor device of this embodiment, the inverted period is provided between the writing period and the retention period of the semiconductor device, as illustrated in FIGS. 2B and 2D. The inverted period is a period in which an electric field from the other of the source and the drain of the transistor 20 to the gate thereof and an electric field from the other of the source and the drain of the transistor 30 to the gate thereof are intentionally strengthened. Accordingly, the decrease of the positive electric charge accumulated in the node B and node C (decrease in the potentials of the node B and node C) can converge in a short time. As a result, the temporal change of data in the retention period can be suppressed. In particular, in the semiconductor device of this embodiment which can retain multilevel data, any of the driving methods illustrated in FIG. 2B and FIG. 2D is effectively applied. Specifically, in the semiconductor device of this embodiment, it is possible to determine data of three or more values in accordance with the amount of the positive electric charge retained in a particular node. Therefore, an effect of the decrease in the amount of electric charge generated in the retention period on a change of retained data tends to be clearly understood. In contrast, any of the driving methods illustrated in FIG. 2B and FIG. 2D, which can suppress the decrease in the amount of electric charge in the retention period, is effective in improvement of data retention properties. Further, employing any of the driving methods illustrated in FIG. 2B and FIG. 2D makes it possible to provide a semiconductor device in which retained data is multilevel (from binary to four values, from four values to eight values, or the like).

Note that this embodiment or part of this embodiment can be freely combined with the other embodiments or part of the other embodiments.

Embodiment 3

In this embodiment, an example of a transistor included in any of the semiconductor devices described in the above embodiments will be described. Specifically, an example of a semiconductor device having a transistor formed using a substrate including a semiconductor material and a transistor formed using an oxide semiconductor layer will be described.

Structural Example

Figure 3:
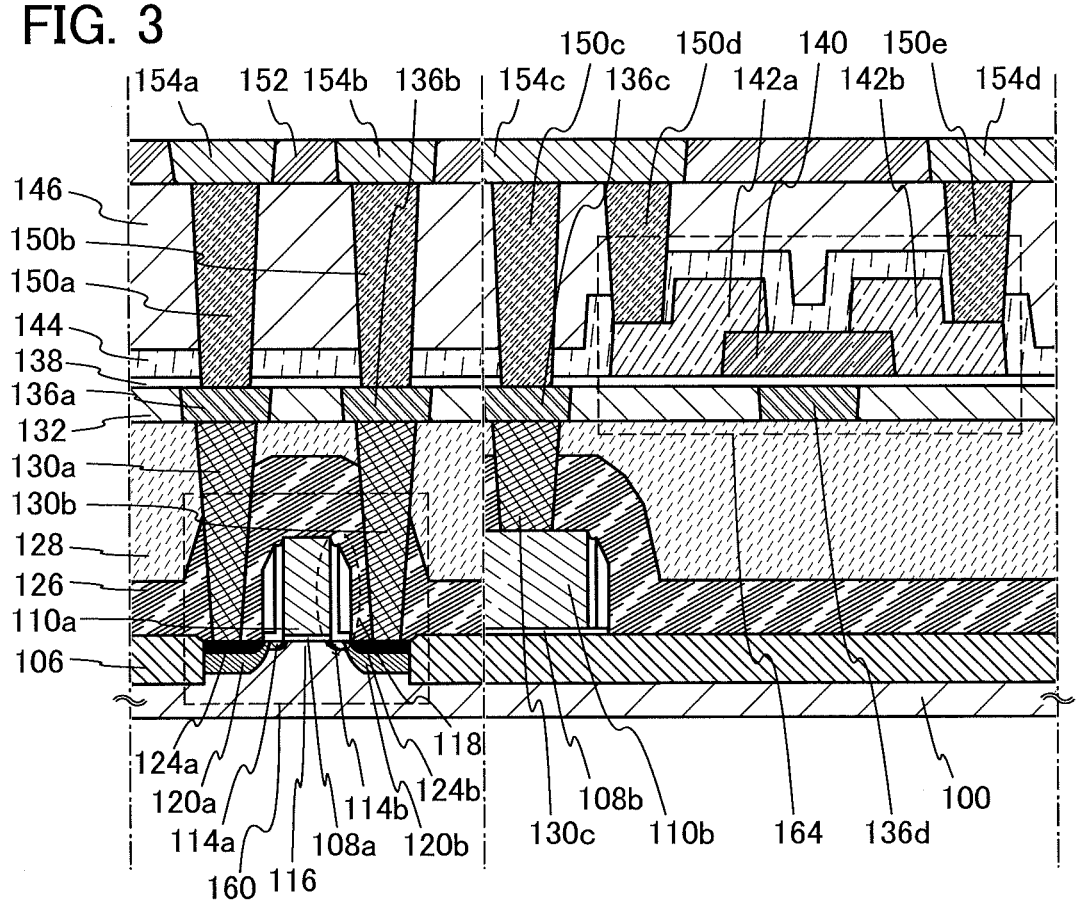
FIG. 3 illustrates an example of a transistor.

FIG. 3 is a cross-sectional view of a semiconductor device of this embodiment.

A transistor 160 illustrated in FIG. 3 includes a channel region 116 provided over a substrate 100 including a semiconductor material, a pair of impurity regions 114*a* and 114*b* and a pair of high concentration impurity regions 120*a* and 120*b* (these regions are also collectively referred to simply as impurity regions) which are provided so that the channel region 116 is interposed therebetween, a gate insulating film 108a provided over the channel region 116, a gate layer 110a provided over the gate insulating film 108a, a source layer 130a which is electrically connected to the impurity region 114a, and a drain layer 130b which is electrically connected to the impurity region 114b.

Note that sidewall insulating layers 118 are provided on side surfaces of the gate layer 110a. The substrate 100 including a semiconductor material is provided with the pair of high concentration impurity regions 120a and 120b in regions which do not overlap with the sidewall insulating layers 118. The substrate 100 is also provided with a pair of metal compound regions 124a and 124b over the pair of high concentration impurity regions 120a and 120b. Element isolation insulating layers 106 are provided over the substrate 100 so as to surround the transistor 160. An interlayer insulating layer 126 and an interlayer insulating layer 128 are provided so as to cover the transistor 160. The source layer 130a is electrically connected to the metal compound region 124a through an opening formed in the interlayer insulating layer 126 and the interlayer insulating layer 128, and the drain layer 130b is electrically connected to the metal compound region 124b through an opening formed in the interlayer insulating layer 126 and the interlayer insulating layer 128. That is, the source layer 130a is electrically connected to the high concentration impurity region 120a and the impurity region 114a through the metal compound region 124a, and the drain layer 130b is electrically connected to the high concentration impurity region 120b and the impurity region 114b through the metal compound region 124b.

In addition, as layers below a transistor 164 described later, there are an insulating layer 108b including the same material as the gate insulating film 108a, an electrode layer 110b including the same material as the gate layer 110a, and an electrode layer 130c including the same material as the source layer 130a and the drain layer 130b.

The transistor 164 illustrated in FIG. 3 includes a gate layer 136d provided over the interlayer insulating layer 128, a gate insulating film 138 provided over the gate layer 136d, an oxide semiconductor layer 140 provided over the gate insulating film 138, and a source layer 142a and a drain layer 142b which are provided over the oxide semiconductor layer 140 and electrically connected to the oxide semiconductor layer 140.

Here, the gate layer 136d is provided to be embedded in an insulating layer 132 formed over the interlayer insulating layer 128. Like the gate layer 136d, an electrode layer 136a and an electrode layer 136b are formed, which are respectively in contact with the source layer 130a and the drain layer 130b included in the transistor 160. In addition, an electrode layer 136c in contact with the electrode layer 130c is formed.

A protective insulating layer 144 is provided over the transistor 164 so as to be in contact with part of the oxide semiconductor layer 140. An interlayer insulating layer 146 is provided over the protective insulating layer 144. Here, openings reaching the source layer 142a and the drain layer 142b are provided in the protective insulating layer 144 and the interlayer insulating layer 146. An electrode layer 150d and an electrode layer 150e are formed, which are respectively in contact with the source layer 142a and the drain layer 142b through the openings. Like the electrode layers 150d and 150e, an electrode layer 150a, an electrode layer 150b, and an electrode layer 150c are formed, which are respectively in contact with the electrode layer 136a, the electrode layer 136b, and the electrode layer 136c through openings provided in the gate insulating film 138, the protective insulating layer 144, and the interlayer insulating layer 146.

The oxide semiconductor layer 140 is highly purified by sufficiently removing an impurity such as hydrogen therein. Specifically, the hydrogen concentration in the oxide semiconductor layer 140 is $5 \times 10^{19}$ (atoms/cm$^3$) or lower. Note that the preferable hydrogen concentration in the oxide semiconductor layer 140 is $5 \times 10^{18}$ (atoms/cm$^3$) or lower, and the much preferable concentration is $5 \times 10^{17}$ (atoms/cm$^3$) or lower. The transistor 164 with excellent off-state current characteristics can be obtained with the use of the oxide semiconductor layer 140 that is highly purified by a sufficient reduction in hydrogen concentration. For example, in the case where the drain voltage Vd is +1 V or +10 V, the leakage current is $1 \times 10^{-13}$ [A] or less. Applying the highly purified oxide semiconductor layer 140 with a sufficiently reduced hydrogen concentration allows a reduction in the leakage current of the transistor 164. The hydrogen concentration in the oxide semiconductor layer 140 is measured by secondary ion mass spectrometry (SIMS).

Further, an insulating layer 152 is provided over the interlayer insulating layer 146, and an electrode layer 154a, an electrode layer 154b, an electrode layer 154c, and an electrode layer 154d are provided so as to be embedded in the insulating layer 152. Note that the electrode layer 154a is in contact with the electrode layer 150a, the electrode layer 154b is in contact with the electrode layer 150b, the electrode layer 154c is in contact with the electrode layer 150c and the electrode layer 150d, and the electrode layer 154d is in contact with the electrode layer 150e.

The source layer 130a in the transistor 160 of this embodiment is electrically connected to the electrode layers 136a, 150a, and 154a which are provided in the upper region. Thus, conductive layers for the above-described electrode layers are formed as appropriate, whereby the source layer 130a in the transistor 160 can be electrically connected to any of electrode layers included in the transistor 164 provided in the upper region. The drain layer 130b in the transistor 160 can also be electrically connected to any of electrode layers included in the transistor 164 provided in the upper region. Although not illustrated in FIG. 3, the gate layer 110a in the transistor 160 can be electrically connected to any of the electrode layers included in the transistor 164 through an electrode layer provided in the upper region.

Similarly, the source layer 142a in the transistor 164 described in this embodiment is electrically connected to the electrode layers 130c and 110b provided in the lower region. Thus, conductive layers for the above-described electrode layers are formed as appropriate, whereby the source layer 142a in the transistor 164 can be electrically connected to any of the gate layer 110a, the source layer 130a, and the drain layer 130b which are included in the transistor 160 provided in the lower region. Although not illustrated in FIG. 3, the gate layer 136d or the drain layer 142b in the transistor 164 can be electrically connected to any of electrode layers included in the transistor 160 through an electrode layer provided in the lower region.

Example of Fabricating Steps

Next, examples of methods for fabricating the transistor 160 and the transistor 164 will be described. Hereinafter, a method for fabricating the transistor 160 is described first with reference to FIGS. 4A to 4H, and a method for fabricating the transistor 164 is then described with reference to FIGS. 5A to 5G and FIGS. 6A to 6D.

Figure 4A:
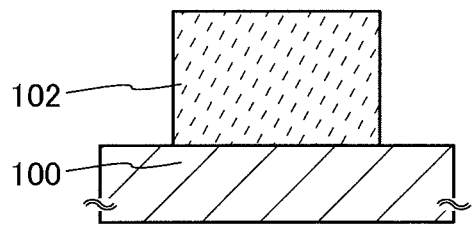
FIGS. 4A to 4H illustrate an example of steps for fabricating a transistor.
Figure 4E:
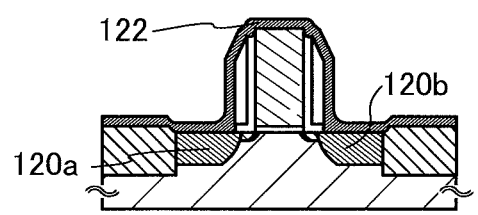

First, the substrate 100 including a semiconductor material is prepared (see FIG. 4A). As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Here, an example of using a single crystal silicon substrate as the substrate 100 including a semiconductor material is described. Note that in general, the "SOI substrate" means a substrate in which a silicon semiconductor layer is provided on an insulating surface. In this specification and the like, the "SOI substrate" also includes a substrate in which a semiconductor layer containing a material other than silicon is provided over an insulating surface in its category. That is, a semiconductor layer included in the "SOI substrate" is not limited to a silicon semiconductor layer. Further, the "SOI substrate" includes a structure in which a semiconductor layer is formed over an insulating substrate such as a glass substrate with an insulating layer interposed therebetween.

A protective layer 102 serving as a mask for forming an element isolation insulating layer is formed over the substrate 100 (see FIG. 4A). As the protective layer 102, an insulating layer formed using silicon oxide, silicon nitride, silicon nitride oxide, or the like can be used, for example. Note that before or after this step, an impurity element imparting n-type conductivity or an impurity element imparting p-type conductivity may be added to the substrate 100 in order to control the threshold voltage of the semiconductor device. When the semiconductor is formed using silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., in an exposed region) is removed by etching, using the protective layer 102 as a mask. Thus, an isolated semiconductor region 104 is formed (see FIG. 4B). As the etching, dry etching is preferably performed, but wet etching can be performed. An etching gas and an etchant can be selected as appropriate depending on a material of a layer to be etched.

Figure 4B:
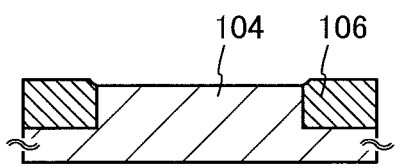
Figure 4F:
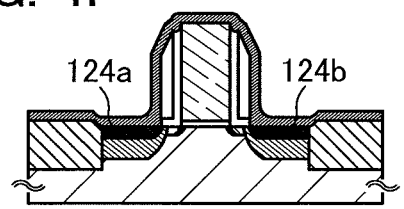

Then, an insulating layer is formed so as to cover the semiconductor region 104, and the insulating layer in a region overlapping with the semiconductor region 104 is selectively removed, so that the element isolation insulating layers 106 are formed (see FIG. 4B). The insulating layer is formed using silicon oxide, silicon nitride, silicon nitride oxide, or the like. As a removal method of the insulating layer, polishing treatment such as chemical mechanical polishing (CMP), etching, or the like can be given, and any of the above treatment may be used. Note that the protective layer 102 is removed after the formation of the semiconductor region 104 or after the formation of the element isolation insulating layers 106.

Next, an insulating layer is formed over the semiconductor region 104, and a layer including a conductive material is formed over the insulating layer.

The insulating layer serves as a gate insulating film later and preferably has a single-layer structure or a layered structure using a film containing silicon oxide, silicon nitride oxide, silicon nitride, hafnium oxide, aluminum oxide, tantalum oxide, or the like which is obtained by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, or nitrogen. There is no particular limitation on the thickness of the insulating layer, but the insulating layer can be formed in the range of greater than or equal to 1 nm and less than or equal to 100 nm, for example.

The layer including a conductive material can be formed using a metal material such as aluminum, copper, titanium, tantalum, or tungsten. The layer including a conductive material may be formed using a semiconductor material such as polycrystalline silicon containing a conductive material. There is no particular limitation on the method for forming the layer containing a conductive material, and a variety of film formation methods such as an evaporation method, a CVD method, a sputtering method, or a spin coating method can be employed. Note that this embodiment shows an example of the case where the layer containing a conductive material is formed using a metal material.

Figure 4C:
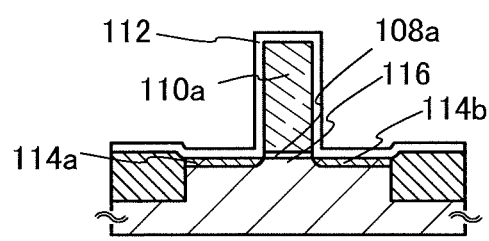

After that, the insulating layer and the layer including a conductive material are selectively etched, so that the gate insulating film 108a and the gate layer 110a are formed (see FIG. 4C).

Next, an insulating layer 112 that covers the gate layer 110a is formed (see FIG. 4C). Then, boron (B), phosphorus (P), arsenic (As), or the like is added to the semiconductor region 104, so that the pair of impurity regions 114a and 114b with a shallow junction are formed (see FIG. 4C). Note that by formation of the pair of impurity regions 114a and 114b, the channel region 116 is formed in the semiconductor region 104 below the gate insulating film 108a (see FIG. 4C). Here, the concentration of the impurity added can be set as appropriate; the concentration is preferably increased when the size of a semiconductor element is extremely decreased. Although the pair of impurity regions 114a and 114b are formed after formation of the insulating layer 112 here, the insulating layer 112 may be formed after formation of the pair of impurity regions 114a and 114b.

Figure 4G:
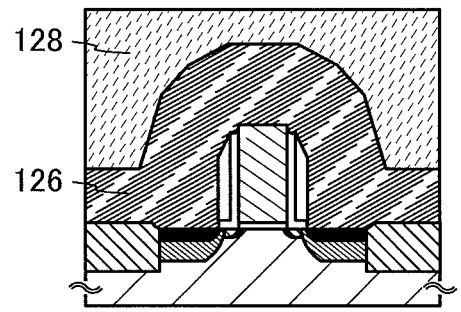
Figure 4D:
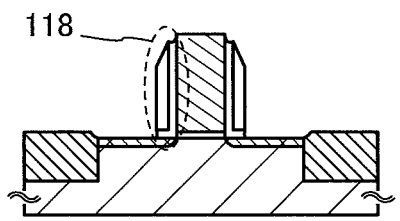

Next, the sidewall insulating layers 118 are formed (see FIG. 4D). An insulating layer is formed so as to cover the insulating layer 112 and then subjected to highly anisotropic etching, whereby the sidewall insulating layers 118 can be formed in a self-aligned manner. At this time, by partly etching the insulating layer 112, an upper surface of the gate layer 110a and upper surfaces of the impurity regions 114a and 114b are preferably exposed.

Next, an insulating layer is formed so as to cover the gate layer 110a, the pair of impurity regions 114a and 114b, the sidewall insulating layers 118, and the like. Then, boron (B), phosphorus (P), arsenic (As), or the like is added to part of the impurity regions 114a and 114b, so that the pair of high concentration impurity regions 120a and 120b are formed (see FIG. 4E). After that, the insulating layer is removed, and a metal layer 122 is formed so as to cover the gate layer 110a, the sidewall insulating layers 118, the pair of high concentration impurity regions 120a and 120b, and the like (see FIG. 4E). The metal layer 122 can be formed by a variety of methods, such as a vacuum deposition method, a sputtering method, and a spin coating method. The metal layer 122 is preferably formed using a metal material that reacts with a semiconductor material included in the semiconductor region 104 to be a low-resistance metal compound. Examples of such metal materials include titanium, tantalum, tungsten, nickel, cobalt, and platinum.

Next, heat treatment is performed, so that the metal layer 122 reacts with the semiconductor material. By this heat treatment, the pair of metal compound regions 124a and 124b in contact with the pair of high concentration impurity regions 120a and 120b are formed (see FIG. 4F). Note that when the gate layer 110a is formed using polycrystalline silicon or the like, a metal compound region is also formed in a region of the gate layer 110a in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the pair of metal compound regions 124a and 124b are formed.

Then, the interlayer insulating layer 126 and the interlayer insulating layer 128 are formed so as to cover the components formed in the above steps (see FIG. 4G). The interlayer insulating layers 126 and 128 can be formed using an inorganic insulating material such as silicon oxide, silicon nitride oxide, silicon nitride, hafnium oxide, aluminum oxide, or tantalum oxide. Alternatively, the interlayer insulating layers 126 and 128 can be formed using an organic insulating material such as polyimide or acrylic. Note that a two-layer structure of the interlayer insulating layer 126 and the interlayer insulating layer 128 is employed here; however, the structure of an interlayer insulating layer is not limited to this structure. After the formation of the interlayer insulating layer 128, a surface of the interlayer insulating layer 128 is preferably planarized with CMP, etching, or the like.

Figure 4H:
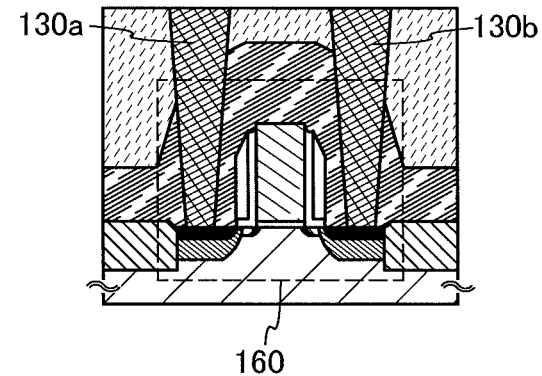

After that, openings reaching the pair of metal compound regions 124a and 124b are formed in the interlayer insulating layers, and the source layer 130a and the drain layer 130b are formed in the openings (see FIG. 4H). A conductive layer is formed by a PVD method, a CVD method, or the like in a region including the openings, and part of the conductive layer is removed by etching or CMP, so that the source layer 130a and the drain layer 130b can be formed.

It is preferable that the source layer 130a and the drain layer 130b be formed to have a planar surface. For example, when a thin titanium film or a thin titanium nitride film is formed in a region including the openings and then a tungsten film is formed to be embedded in the openings, excess tungsten, titanium, titanium nitride, or the like is removed and the planarity of the surface can be improved by subsequent CMP. In such a manner, the surface including the source layer 130a and the drain layer 130b is planarized, whereby an electrode, a wiring, an insulating layer, a semiconductor layer, and the like can be favorably formed in later steps.

Note that here, only the source layer 130a and the drain layer 130b which are in contact with the pair of metal compound regions 124a and 124b are illustrated; however, an electrode layer serving as a wiring (e.g., the electrode layer 130c in FIG. 3) or the like can be formed together in this step. There is no particular limitation on a material for forming the source layer 130a and the drain layer 130b, and a variety of conductive materials can be used. For example, a conductive material such as molybdenum, titanium, chromium, tantalum, tungsten, aluminum, copper, neodymium, or scandium can be used.

Through the above steps, the transistor 160 using the substrate 100 including a semiconductor material is formed. Note that an electrode, a wiring, an insulating layer, or the like may be further formed after the above step. When the wiring has a multilayer wiring structure which is a layered structure including an interlayer insulating layer and a conductive layer, a highly integrated circuit can be provided.

Next, steps for fabricating the transistor 164 over the interlayer insulating layer 128 will be described with reference to FIGS. 5A to 5G and FIGS. 6A to 6D. Note that FIGS. 5A to 5G and FIGS. 6A to 6D illustrate steps for fabricating various electrode layers, the transistor 164, and the like over the interlayer insulating layer 128, and a description of the transistor 160 and the like placed below the transistor 164 is omitted.

First, the insulating layer 132 is formed over the interlayer insulating layer 128, the source layer 130a, the drain layer 130b, and the electrode layer 130c (see FIG. 5A). The insulating layer 132 can be formed by a PVD method, a CVD method, or the like. The insulating layer 132 can be formed using an inorganic insulating material such as silicon oxide, silicon nitride oxide, silicon nitride, hafnium oxide, aluminum oxide, or tantalum oxide.

Next, openings that reach the source layer 130a, the drain layer 130b, and the electrode layer 130c are formed in the insulating layer 132. At this time, another opening is formed in a region where the gate layer 136d is to be formed later. Then, a conductive layer 134 is formed to be embedded in the openings (see FIG. 5B). The openings can be formed by a method such as etching using a mask. The mask can be formed by a method such as light exposure using a photomask. Either wet etching or dry etching may be used as the etching; dry etching is preferably used in terms of microfabrication. The conductive layer 134 can be formed by a film formation method such as a PVD method or a CVD method. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of deoxidizing an oxide film at an interface so as to reduce contact resistance to the lower electrode layers (here, the source layer 130a, the drain layer 130b, the electrode layer 130c, and the like). The titanium nitride film formed after the formation of the titanium film has a barrier function of preventing diffusion of the conductive material. A copper film may be formed by a plating method after the formation of the barrier film of titanium, titanium nitride, or the like.

After the conductive layer 134 is formed, part of the conductive layer 134 is removed by etching, CMP, or the like, so that the insulating layer 132 is exposed and the electrode layers 136a, 136b, and 136c, and the gate layer 136d are formed (see FIG. 5C). Note that when the electrode layers 136a, 136b, and 136c, and the gate layer 136d are formed by removing part of the conductive layer 134, it is preferable that a planar surface be formed. By planarizing the surfaces of the insulating layer 132, the electrode layers 136a, 136b, and 136c, and the gate layer 136d in such a manner, an electrode, a wiring, an insulating layer, a semiconductor layer, and the like can be favorably formed in later steps.

Next, the gate insulating film 138 is formed so as to cover the insulating layer 132, the electrode layers 136a, 136b, and 136c, and the gate layer 136d (see FIG. 5D). The gate insulating film 138 can be formed by a CVD method, a sputtering method, or the like. The gate insulating film 138 is preferably formed using silicon oxide, silicon nitride, silicon oxynitride, silicon nitride oxide, aluminum oxide, hafnium oxide, tantalum oxide, or the like. Note that the gate insulating film 138 may have a single-layer structure or a layered structure. For example, the gate insulating film 138 made of silicon oxynitride can be formed by a plasma-enhanced CVD method using silane ($SiH_4$), oxygen, and nitrogen as a source gas. There is no particular limitation on the thickness of the gate insulating film 138; the gate insulating film 138 can have a thickness greater than or equal to 10 nm and less than or equal to 500 nm, for example. When a layered structure is employed, the gate insulating film 138 is preferably formed by stacking a first gate insulating film with a thickness greater than or equal to 50 nm and less than or equal to 200 nm and a second gate insulating film with a thickness greater than or equal to 5 nm and less than or equal to 300 nm over the first gate insulating layer, for example.

Note that an oxide semiconductor which is made to be an i-type oxide semiconductor or a substantially i-type oxide semiconductor by removing an impurity (an oxide semiconductor which is highly purified) is extremely sensitive to an interface state density or to the interface electric charge; therefore, when such an oxide semiconductor is used for an oxide semiconductor layer, an interface between the oxide semiconductor layer and a gate insulating film is important. In other words, the gate insulating film 138 that is to be in contact with a highly purified oxide semiconductor layer needs to have high quality.

For example, a high-density plasma-enhanced CVD method using microwaves (2.45 GHz) is preferable in that it produces the compact high-quality gate insulating film 138 of high withstand voltage. The highly purified oxide semiconductor layer and the high-quality gate insulating film are in close contact with each other, so that the interface state density can be reduced and favorable interface characteristics can be obtained.

It is needless to say that, even when a highly purified oxide semiconductor layer is used, another method such as a sputtering method or a plasma-enhanced CVD method can be employed as long as a high-quality insulating layer can be formed as a gate insulating film. Moreover, it is possible to use an insulating layer whose quality and interface characteristics are improved with heat treatment performed after the formation of the insulating layer. In any case, a layer is acceptable which is of good quality as the gate insulating film 138, and which reduces interface state density between the gate insulating film and the oxide semiconductor layer so that a good interface is formed.

Next, an oxide semiconductor layer is formed over the gate insulating film 138, and the oxide semiconductor layer is processed by etching using a mask or the like, forming the island-shaped oxide semiconductor layer 140 (see FIG. 5E).

As the oxide semiconductor layer, one or more elements selected from In, Ga, Sn, Zn, Al, Mg, Hf, and Lanthanoid is/are included. For example, an In—Sn—Ga—Zn—O-based oxide semiconductor layer, an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, a Sn—Al—Zn—O-based oxide semiconductor layer, an In—Hf—Zn—O-based oxide semiconductor layer, an In—La—Zn—O-based oxide semiconductor layer, an In—Ce—Zn—O-based oxide semiconductor layer, an In—Pr—Zn—O-based oxide semiconductor layer, an In—Nd—Zn—O-based oxide semiconductor layer, an In—Pm—Zn—O-based oxide semiconductor layer, an In—Sm—Zn—O-based oxide semiconductor layer, an In—Eu—Zn—O-based oxide semiconductor layer, an In—Gd—Zn—O-based oxide semiconductor layer, an In—Tb—Zn—O-based oxide semiconductor layer, an In—Dy—Zn—O-based oxide semiconductor layer, an In—Ho—Zn—O-based oxide semiconductor layer, an In—Er—Zn—O-based oxide semiconductor layer, an In—Tm—Zn—O-based oxide semiconductor layer, an In—Yb—Zn—O-based oxide semiconductor layer, an In—Lu—Zn—O-based oxide semiconductor layer, a Zn—Mg—O-based oxide semiconductor layer, a Sn—Mg—O-based oxide semiconductor layer, an In—Mg—O-based oxide semiconductor layer, an In—Ga—O-base oxide semiconductor, an In—Zn—O-based oxide semiconductor layer, a Sn—Zn—O-based oxide semiconductor layer, an Al—Zn—O-based oxide semiconductor layer, an In—O-based oxide semiconductor layer, a Sn—O-based oxide semiconductor layer, or a Zn—O-based oxide semiconductor layer is used. In particular, an amorphous oxide semiconductor layer is preferable. In this embodiment, as the oxide semiconductor layer, an amorphous oxide semiconductor layer is formed by a sputtering method using an In—Ga—Zn—O-based metal oxide target. The addition of silicon to an amorphous oxide semiconductor layer suppresses the crystallization of the layer; therefore, the oxide semiconductor layer can be formed using a target containing $SiO_2$ at greater than or equal to 2 wt. % and less than or equal to 10 wt. %.

As a target used for forming an oxide semiconductor layer by a sputtering method, a metal oxide target containing zinc oxide or the like as its main component can be used, for example. A metal oxide target containing In, Ga, and Zn (as the composition ratio, the ratio of $In_2O_3$ to $Ga_2O_3$ and ZnO is 1:1:1 [molar ratio], or the ratio of In to Ga and Zn is 1:1:0.5 [atomic ratio]) can also be used, for example. As the metal oxide target containing In, Ga, and Zn, a target in which the composition ratio of In to Ga and Zn is 1:1:1 [atomic ratio] or a target in which the composition ratio of In to Ga and Zn is 1:1:2 [atomic ratio] may also be used. The filling rate of the metal oxide target is greater than or equal to 90% and less than or equal to 100%, preferably greater than or equal to 95% (for example, 99.9%). A dense oxide semiconductor layer is formed using a metal oxide target with a high filling rate.

When an In—Zn—O-based material is used as an oxide semiconductor, a target to be used has a composition ratio given by the equation In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, when a target used for forming the In—Zn—O-based oxide semiconductor has a composition ratio of In:Zn:O=X:Y:Z in an atomic ratio, Z>(1.5X+Y).

The atmosphere in which the oxide semiconductor layer is formed is preferably a rare gas (typically argon) atmosphere, an oxygen atmosphere, or a mixed atmosphere containing a rare gas (typically argon) and oxygen. Specifically, a high-purity gas is preferably used, in which an impurity such as hydrogen, water, hydroxyl, or hydride is reduced to approximately several parts per million (ppm) (preferably approximately several parts per billion (ppb)).

In forming the oxide semiconductor layer, the substrate is held in a treatment chamber that is maintained at reduced pressure and the substrate temperature is set to higher than or equal to 100° C. and lower than or equal to 600° C., preferably higher than or equal to 200° C. and lower than or equal to 400° C. The oxide semiconductor layer is formed while the substrate is heated, so that the impurity concentration in the oxide semiconductor layer can be reduced. In addition, damage by sputtering can be reduced. Then, a sputtering gas from which hydrogen and water are removed is introduced into the treatment chamber from which remaining moisture is being removed, and the oxide semiconductor layer is formed using metal oxide as a target. In order to remove remaining moisture in the treatment chamber, an entrapment vacuum pump is preferably used. For example, a cryopump, an ion pump, or a titanium sublimation pump can be used. The evacuation unit may be a turbo pump provided with a cold trap. In the deposition chamber that is evacuated with the cryopump, a hydrogen atom and a compound containing a hydrogen atom such as water ($H_2O$) (and preferably also a compound containing a carbon atom), for example, are removed, whereby the impurity concentration in the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power supply is 0.5 kW; and the atmosphere is oxygen (the flow rate ratio of oxygen is 100%). Note that the use of a pulse direct-current (DC) power source is preferable in that it reduces dust and in that it makes the film thickness even. The thickness of the oxide semiconductor layer is greater than or equal to 2 nm and less than or equal to 200 nm, preferably greater than or equal to 5 nm and less than or equal to 30 nm. Note that an appropriate thickness differs depending on an oxide semiconductor material, and the thickness is set as appropriate depending on the material to be used.

Note that before the oxide semiconductor layer is formed by a sputtering method, dust on a surface of the gate insulating film 138 is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that an atmosphere of nitrogen, helium, oxygen, or the like may be used instead of an argon atmosphere.

As an etching method of the oxide semiconductor layer, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

Examples of the etching gas for dry etching are a gas containing chlorine (a chlorine-based gas such as chlorine ($Cl_2$), boron trichloride ($BCl_3$), silicon tetrachloride ($SiCl_4$), or carbon tetrachloride ($CCl_4$)) and the like. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the substrate side, and the electrode temperature on the substrate side) are set as appropriate.

As an etchant used for wet etching, a mixed solution of phosphoric acid, acetic acid, and nitric acid, or the like can be used. Further, an etchant such as ITO-07N (produced by KANTO CHEMICAL CO., INC.) may be used.

Then, first heat treatment is preferably performed on the oxide semiconductor layer. The oxide semiconductor layer can be dehydrated or dehydrogenated by the first heat treatment. The temperature of the first heat treatment is higher than or equal to 300° C. and lower than or equal to 750° C., preferably higher than or equal to 400° C. and lower than the strain point of the substrate. For example, the substrate is introduced into an electric furnace in which a resistance heating element or the like is used and the oxide semiconductor layer 140 is subjected to heat treatment at 450° C. for one hour in a nitrogen atmosphere. The oxide semiconductor layer 140 is not exposed to the air during the heat treatment so that entry of water and hydrogen can be prevented.

The heat treatment apparatus is not limited to the electric furnace and can be an apparatus for heating an object to be processed by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out of the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6 N (99.9999%) or more, preferably 7 N (99.99999%) or more (i.e., the impurity concentration is 1 ppm or less, preferably 0.1 ppm or less).

Depending on the conditions of the first heat treatment or the material of the oxide semiconductor layer, the oxide semiconductor layer is sometimes crystallized to be microcrystalline or polycrystalline. For example, the oxide semiconductor layers may crystallize to become microcrystalline semiconductor layers having a degree of crystallization of 90% or more, or 80% or more. Further, depending on the conditions of the first heat treatment or the material of the oxide semiconductor layer, the oxide semiconductor layer may be an amorphous oxide semiconductor layer containing no crystalline component.

Furthermore, the oxide semiconductor layer sometimes becomes a layer in which a microcrystal (with a grain size greater than or equal to 1 nm and less than or equal to 20 nm, typically greater than or equal to 2 nm and less than or equal to 4 nm) is mixed in an amorphous oxide semiconductor (e.g., a surface of the oxide semiconductor layer).

The electrical characteristics of the oxide semiconductor layer can be changed by aligning microcrystals in an amorphous semiconductor. For example, in the case where the oxide semiconductor layer is formed using an In—Ga—Zn—O-based metal oxide target, the electrical characteristics of the oxide semiconductor layer can be changed by forming, in the oxide semiconductor layer, a microcrystalline portion where crystal grains of $In_2Ga_2ZnO_7$ having electrical anisotropy are aligned.

Specifically, for example, when the crystal grains are arranged so that the c-axis of $In_2Ga_2ZnO_7$ is perpendicular to a surface of the oxide semiconductor layer, the conductivity in the direction parallel to the surface of the oxide semiconductor layer can be improved and insulating properties in the direction perpendicular to the surface of the oxide semiconductor layer can be improved. Furthermore, such a microcrystalline portion has a function of suppressing entry of an impurity such as water or hydrogen into the oxide semiconductor layer.

Note that the oxide semiconductor layer including the microcrystalline portion can be formed by heating the surface of the oxide semiconductor layer by a GRTA process. Further, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography step is performed.

Note that the heat treatment can also be called dehydration treatment, dehydrogenation treatment, or the like because it is effective in dehydrating or dehydrogenating the oxide semiconductor layer 140. It is possible to perform such dehydration treatment or dehydrogenation treatment, for example, after fanning the oxide semiconductor layer, after stacking source and drain layers over the oxide semiconductor layer 140, or after forming a protective insulating layer over the source and drain layers. Such dehydration treatment or dehydrogenation treatment may be conducted once or plural times.

Next, the source layer 142a and the drain layer 142b are formed so as to be in contact with the oxide semiconductor layer 140 (see FIG. 5F). A conductive layer is formed so as to cover the oxide semiconductor layer 140 and then partly etched, so that the source layer 142a and the drain layer 142b can be formed.

The conductive layer can be formed by a CVD method such as a plasma-enhanced CVD method or a PVD method including a sputtering method. As a material for the conductive layer, an element selected from aluminum, chromium, copper, tantalum, titanium, molybdenum, and tungsten; an alloy containing any of these elements as a component; or the like can be used. Moreover, one or more materials selected from manganese, magnesium, zirconium, beryllium, and thorium may be used. Aluminum combined with one or more of elements selected from titanium, tantalum, tungsten, molybdenum, chromium, neodymium, and scandium may be used. The conductive layer can have a single-layer structure or a layered structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in that order.

Here, ultraviolet light, KrF laser light, or ArF laser light is preferably used for light exposure in forming a mask used for etching.

The channel length (L) of the transistor is determined by a distance between a lower edge portion of the source layer 142a and a lower edge portion of the drain layer 142b. Note that in the case where the channel length (L) is less than 25 nm, light exposure for forming a mask is performed with extreme ultraviolet rays whose wavelength is extremely short of several nanometers to several tens of nanometers. In the light exposure by extreme ultraviolet light, the resolution is high and the focus depth is large. For these reasons, the channel length (L) of the transistor to be formed later can be in the range of 10 nm to 1000 nm, and the circuit can operate at higher speed.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source layer 142a or between the oxide semiconductor layer 140 and the drain layer 142b. It is possible to successively form the oxide conductive layer and a metal layer which is to be the source layer 142a and the drain layer 142b (successive formation). The oxide conductive layer can function as a source region or a drain region. The placement of such an oxide conductive layer can reduce the resistance of the source region and the drain region, so that the transistor can operate at high speed.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps for processing into different patterns. That is, a resist mask corresponding to at least two kinds of different patterns can be formed using a multi-tone mask. Thus, the number of light-exposure masks can be reduced and the number of corresponding photolithography steps can also be reduced, whereby a process can be simplified.

Note that plasma treatment is preferably performed with the use of a gas such as $N_2O$, $N_2$, or Ar after the above step. This plasma treatment removes water or the like attached on an exposed surface of the oxide semiconductor layer. Plasma treatment may be performed using a mixed gas of oxygen and argon as well.

Next, the protective insulating layer 144 is formed in contact with part of the oxide semiconductor layer 140 without exposure to the air (see FIG. 5G).

The protective insulating layer 144 can be formed by a method by which an impurity such as water and hydrogen is prevented from being mixed to the protective insulating layer 144, such as a sputtering method, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a layered structure. The substrate temperature for forming the protective insulating layer 144 is preferably higher than or equal to room temperature and lower than or equal to 300° C. The atmosphere for forming the protective insulating layer 144 is preferably a rare gas (typically argon) atmosphere, an oxygen atmosphere, or a mixed atmosphere containing a rare gas (typically argon) and oxygen.

When hydrogen is contained in the protective insulating layer 144, entry of the hydrogen to the oxide semiconductor layer 140 or extraction of oxygen in the oxide semiconductor layer 140 by the hydrogen is caused, thereby making the resistance on the backchannel side of the oxide semiconductor layer 140 low, so that a parasitic channel might be formed. Therefore, it is important not to use hydrogen in forming the protective insulating layer 144 so that the protective insulating layer 144 contains hydrogen as little as possible.

It is preferable to form the protective insulating layer 144 while removing moisture remaining in the treatment chamber. This is in order to prevent hydrogen, hydroxyl, or moisture from entering the oxide semiconductor layer 140 and the protective insulating layer 144.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the film formation chamber that is evacuated with the cryopump, a hydrogen atom and a compound containing a hydrogen atom, such as water ($H_2O$), are removed, for example; thus, the concentration of an impurity contained in the protective insulating layer 144 formed in the film formation chamber can be reduced.

A sputtering gas used for the deposition of the protective insulating layer 144 is preferably a high-purity gas in which the concentration of an impurity such as hydrogen, water, hydroxyl, or hydride is reduced to approximately several parts per million (ppm) (preferably approximately several parts per billion (ppb)).

Next, second heat treatment is preferably performed in an inert gas atmosphere or an oxygen gas atmosphere (at higher than or equal to 200° C. and lower than or equal to 400° C., for example, at higher than or equal to 250° C. and lower than or equal to 350° C.). For example, the second heat treatment is performed at 250° C. for one hour in a nitrogen atmosphere. The second heat treatment can reduce variation in electrical characteristics of the transistor.

Furthermore, heat treatment may be performed at higher than or equal to 100° C. and lower than or equal to 200° C. in the air for greater than or equal to one hour and less than or equal to 30 hours. This heat treatment can be performed at a fixed heating temperature or follow temperature cycles where the temperature repeatedly rises from room temperature to a heating temperature higher than or equal to 100° C. and lower than or equal to 200° C. and drops from the heating temperature to room temperature. This heat treatment may be performed under a reduced pressure before the protective insulating layer is formed. The heat treatment time can be shortened under the reduced pressure. This heat treatment may be performed instead of the second heat treatment or may be performed before or after the second heat treatment, for example.

Figure 6A:
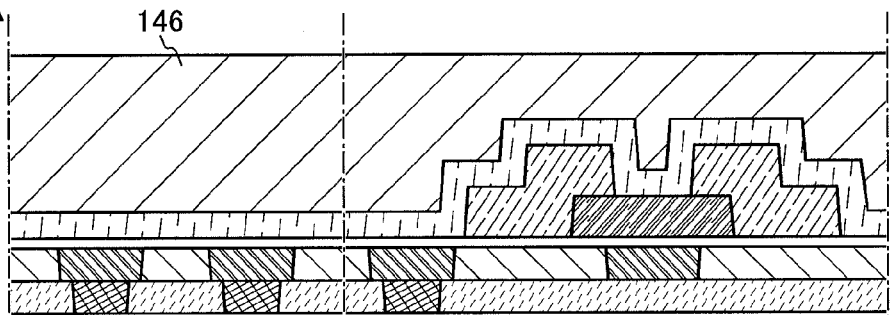
FIGS. 6A to 6D illustrate an example of the steps for fabricating the transistor.
Figure 6B:
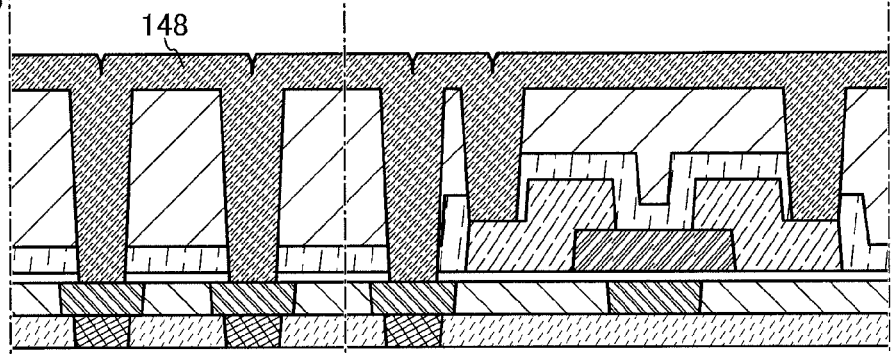

Next, the interlayer insulating layer 146 is formed over the protective insulating layer 144 (see FIG. 6A). The interlayer insulating layer 146 can be formed by a PVD method, a CVD method, or the like. The interlayer insulating layer 146 can be formed using an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with CMP, etching, or the like.

Next, openings reaching the electrode layers 136a, 136b, and 136c, the source layer 142a, and the drain layer 142b are formed in the interlayer insulating layer 146, the protective insulating layer 144, and the gate insulating film 138. Then, a conductive layer 148 is formed to be embedded in the openings (see FIG. 6B). The openings can be formed by a method such as etching using a mask. The mask can be formed by a method such as light exposure using a photomask. Either wet etching or dry etching may be used as the etching; dry etching is preferably used in terms of microfabrication. The conductive layer 148 can be formed by a film formation method such as a PVD method or a CVD method. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of deoxidizing an oxide film at an interface so as to reduce contact resistance to the lower electrodes (here, the electrode layers 136a, 136b, and 136c, the source layer 142a, and the drain layer 142b). The titanium nitride film formed after the formation of the titanium film has a barrier function of preventing diffusion of the conductive material. A copper film may be formed by a plating method after the formation of the barrier film of titanium, titanium nitride, or the like.

Figure 6C:
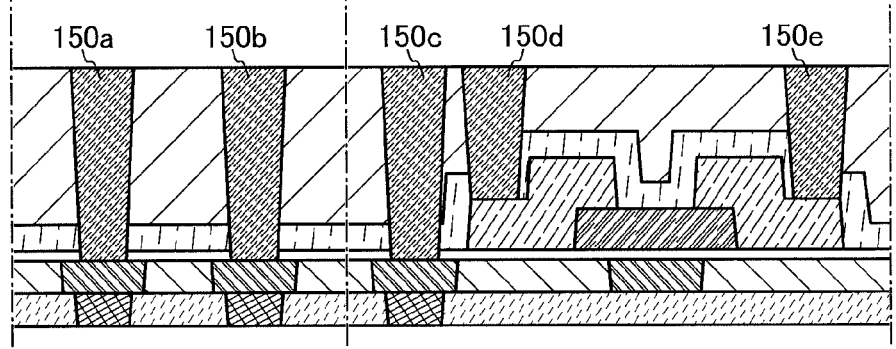
Figure 6D:
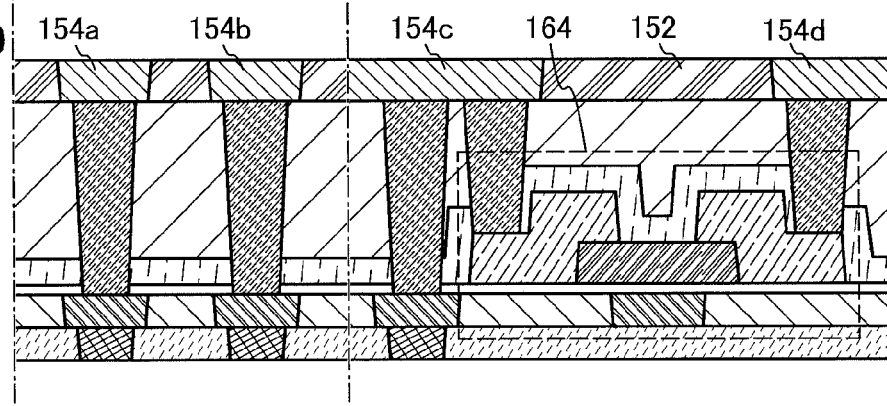

After the conductive layer 148 is formed, part of the conductive layer 148 is removed by a method such as etching or CMP, so that the interlayer insulating layer 146 is exposed and the electrode layer 150a, the electrode layer 150b, the electrode layer 150c, the electrode layer 150d, and the electrode layer 150e are formed (see FIG. 6C). Note that when the electrode layer 150a, the electrode layer 150b, the electrode layer 150c, the electrode layer 150d, and the electrode layer 150e are formed by removing part of the conductive layer 148, it is preferable that a planar surface be formed. By planarizing the surface of the interlayer insulating layer 146, the electrode layer 150a, the electrode layer 150b, the electrode layer 150c, the electrode layer 150d, and the electrode layer 150e, an electrode, a wiring, an insulating layer, a semiconductor layer, or the like can be preferably formed in the later step.

Further, the insulating layer 152 is formed, and openings reaching the electrode layer 150a, the electrode layer 150b, the electrode layer 150c, the electrode layer 150d, and the electrode layer 150e are formed in the insulating layer 152. Then, a conductive layer is formed so as to fill the openings. After that, part of the conductive layer is removed by etching, CMP, or the like, and the insulating layer 152 is thus exposed, thereby forming the electrode layer 154a, the electrode layer 154b, the electrode layer 154c, and the electrode layer 154d (see FIG. 6D). This process is similar to the process for formation of the electrode layer 150a and the like; thus, detailed description is omitted.

Modification Example

FIG. 7, FIGS. 8A and 8B, FIGS. 9A and 9B, and FIGS. 10A and 10B illustrate modification examples of structures of the transistor 164. That is, the structure of the transistor 160 is the same as the above.

Figure 7:
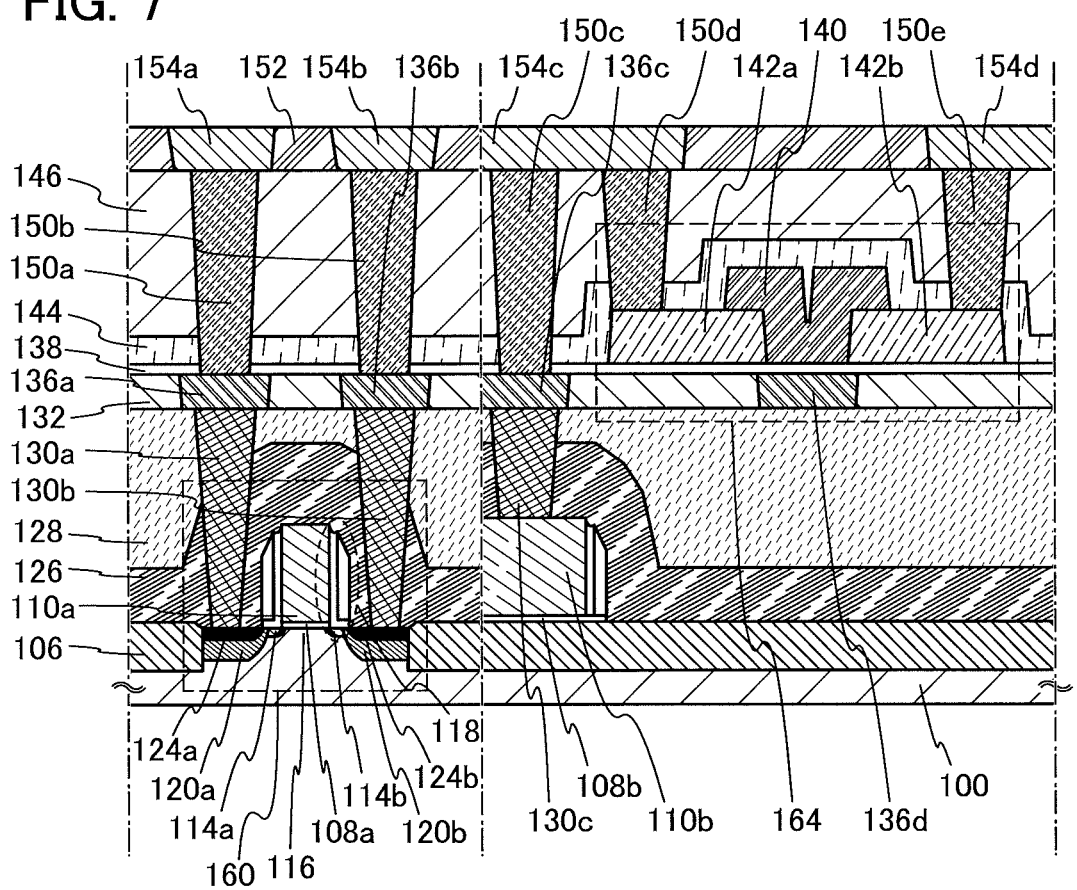
FIG. 7 illustrates an example of a transistor.

FIG. 7 illustrates an example of the transistor 164 having a structure in which the gate layer 136d is placed below the oxide semiconductor layer 140 and the source layer 142a and the drain layer 142b are in contact with a bottom surface of the oxide semiconductor layer 140.

A big difference between the structure in FIG. 7 and the structure in FIG. 3 is the position at which the oxide semiconductor layer 140 is connected to the source layer 142a and the drain layer 142b. That is, an upper surface of the oxide semiconductor layer 140 is in contact with the source layer 142a and the drain layer 142b in the structure in FIG. 3, whereas the bottom surface of the oxide semiconductor layer 140 is in contact with the source layer 142a and the drain layer 142b in the structure in FIG. 7. Moreover, the difference in the contact position results in a different arrangement of other electrode layers, an insulating layer, and the like. Note that the details of each component are the same as those of FIG. 3.

Specifically, the transistor 164 illustrated in FIG. 7 includes the gate layer 136d provided over the interlayer insulating layer 128, the gate insulating film 138 provided over the gate layer 136d, the source layer 142a and the drain layer 142b which are provided over the gate insulating film 138, and the oxide semiconductor layer 140 in contact with the upper surfaces of the source layer 142a and the drain layer 142b. In addition, over the transistor 164, the protective insulating layer 144 is provided so as to cover the oxide semiconductor layer 140.

Figures 8A, 8B:
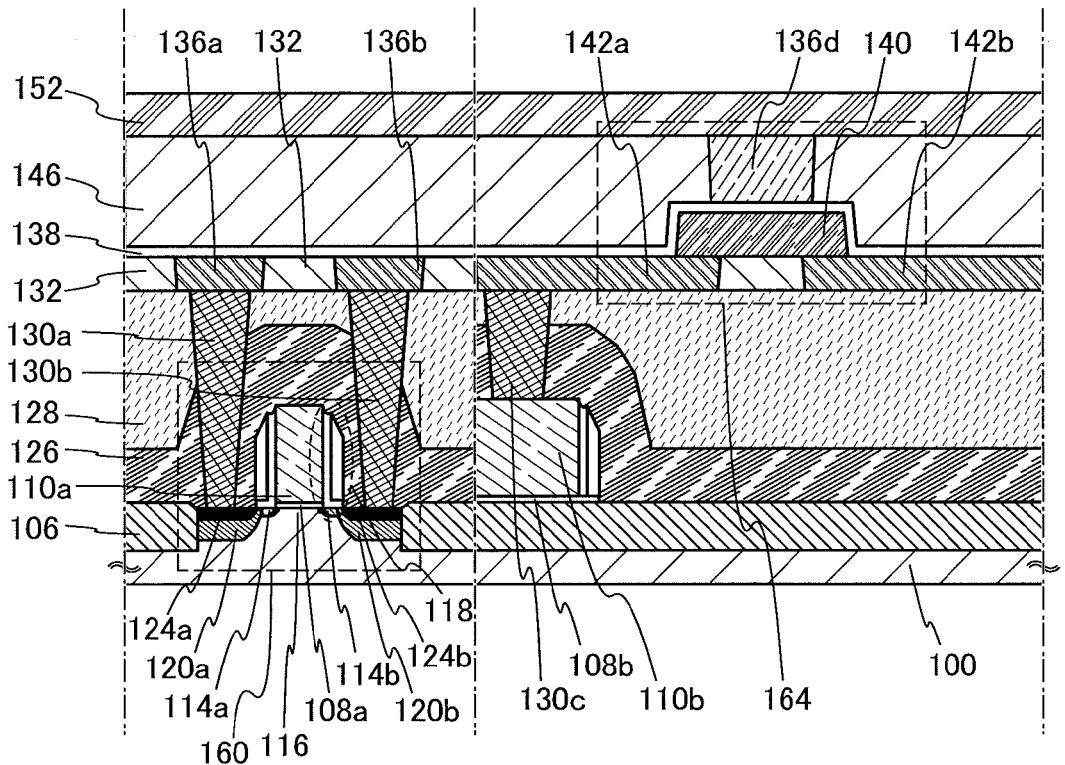
FIGS. 8A and 8B each illustrate an example of a transistor.

FIGS. 8A and 8B each illustrate the transistor 164 in which the gate layer 136d is provided over the oxide semiconductor layer 140. FIG. 8A illustrates an example of a structure in which the source layer 142a and the drain layer 142b are in contact with a bottom surface of the oxide semiconductor layer 140. FIG. 8B illustrates an example of a structure in which the source layer 142a and the drain layer 142b are in contact with an upper surface of the oxide semiconductor layer 140.

A big difference of the structures in FIGS. 8A and 8B from those in FIG. 3 and FIG. 7 is that the gate layer 136d is placed over the oxide semiconductor layer 140. Furthermore, a big difference between the structure in FIG. 8A and the structure in FIG. 8B is that the source layer 142a and the drain layer 142b are in contact with either the bottom surface or the upper surface of the oxide semiconductor layer 140. Moreover, these differences result in a different arrangement of other electrode layers, an insulating layer, and the like. Note that the details of each component are the same as those of FIG. 3, and the like.

Specifically, the transistor 164 illustrated in FIG. 8A includes the source layer 142a and the drain layer 142b which are provided over the interlayer insulating layer 128, the oxide semiconductor layer 140 in contact with the upper surfaces of the source layer 142a and the drain layer 142b, the gate insulating film 138 provided over the oxide semiconductor layer 140, and the gate layer 136d over the gate insulating film 138 in a region overlapping with the oxide semiconductor layer 140.

The transistor 164 illustrated in FIG. 8B includes the oxide semiconductor layer 140 provided over the interlayer insulating layer 128; the source layer 142a and the drain layer 142b which are provided to be in contact with the upper surface of the oxide semiconductor layer 140; the gate insulating film 138 provided over the oxide semiconductor layer 140, the source layer 142a, and the drain layer 142b; and the gate layer 136d provided over the gate insulating film 138 and in a region overlapping with the oxide semiconductor layer 140.

Note that in the structures in FIGS. 8A and 8B, a component (e.g., the electrode layer 150a or the electrode layer 154a) is sometimes omitted from the structure in FIG. 3 and the like. In this case, a secondary effect such as simplification of fabricating steps can be obtained. It is needless to say that a nonessential component can be omitted in the structure in FIG. 3 and the like.

Figure 9A:
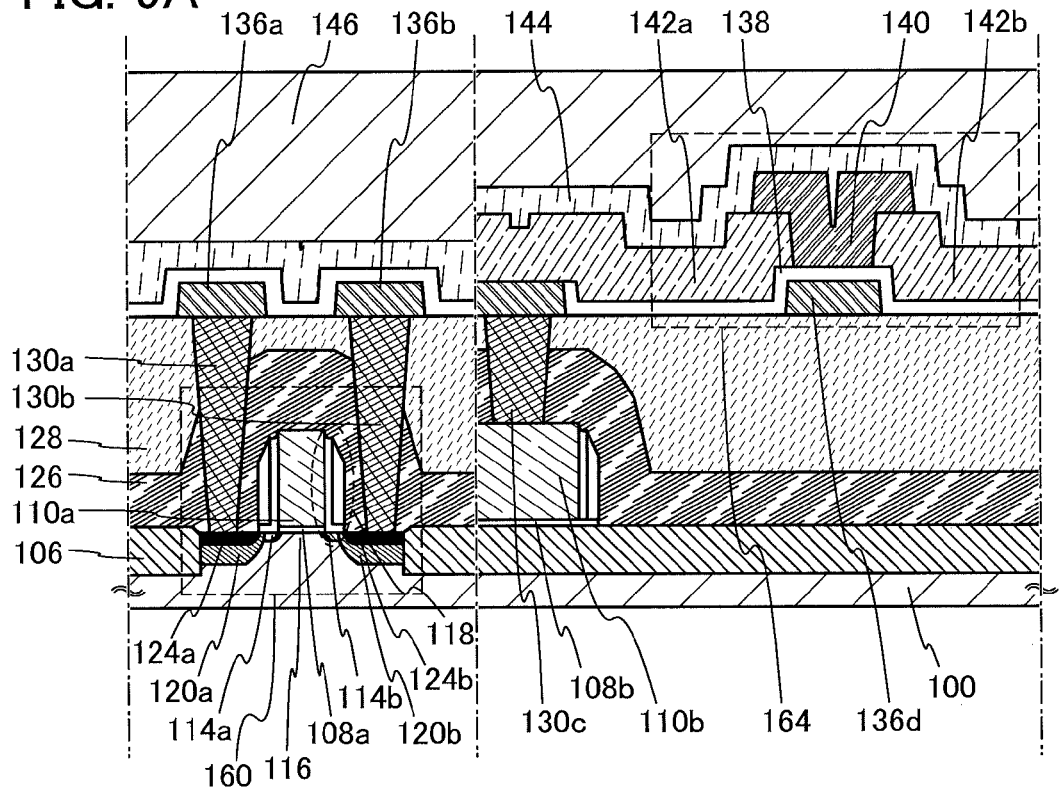
FIGS. 9A and 9B each illustrate an example of a transistor.
Figure 9B:
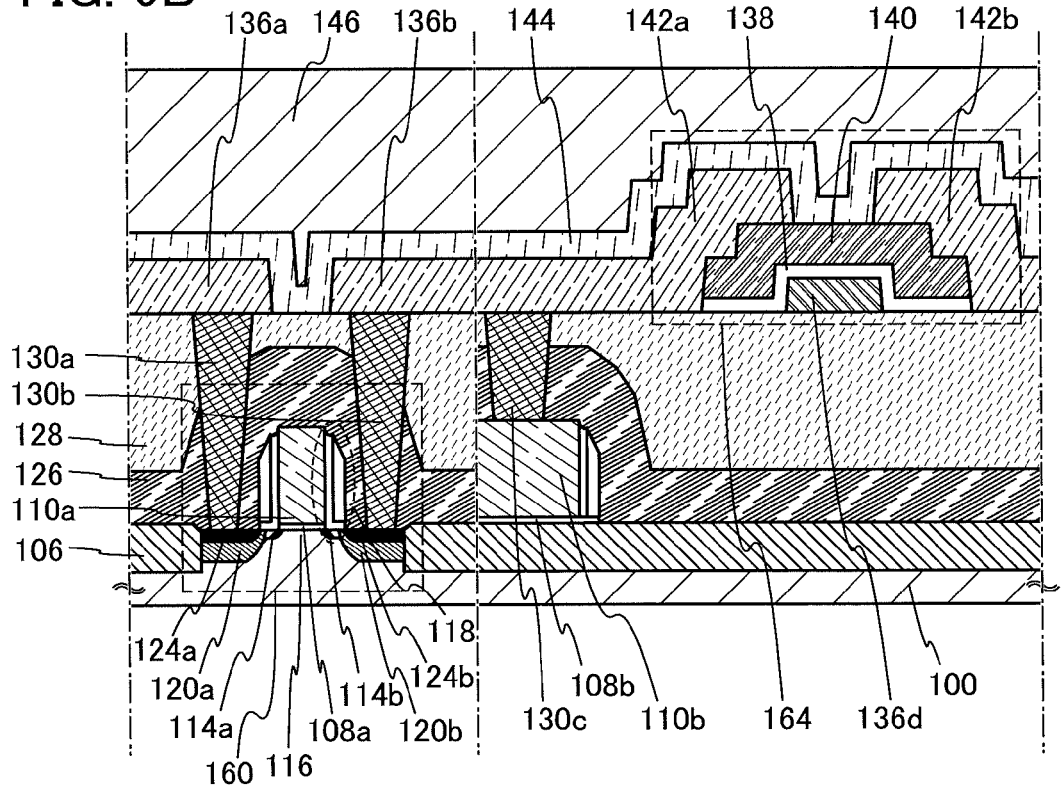

FIGS. 9A and 9B each illustrate the transistor 164 in the case where the size of the element is relatively large and the gate layer 136d is placed under the oxide semiconductor layer 140. In this case, a demand for the planarity of a surface and the coverage is relatively moderate, so that it is not necessary to form a wiring, an electrode, and the like to be embedded in an insulating layer. For example, the gate layer 136d and the like can be formed by patterning after formation of a conductive layer.

A big difference between the structure in FIG. 9A and the structure in FIG. 9B is that the source layer 142a and the drain layer 142b are in contact with either the bottom surface or the upper surface of the oxide semiconductor layer 140. Moreover, these differences result in a different arrangement of other electrode layers, an insulating layer, and the like. The details of each component are the same as those of FIG. 3, and the like.

Specifically, the transistor 164 illustrated in FIG. 9A includes the gate layer 136d provided over the interlayer insulating layer 128, the gate insulating film 138 provided over the gate layer 136d, the source layer 142a and the drain layer 142b which are provided over the gate insulating film 138, and the oxide semiconductor layer 140 which is in contact with the upper surfaces of the source layer 142a and the drain layer 142b.

In addition, the transistor 164 illustrated in FIG. 9B includes the gate layer 136d provided over the interlayer insulating layer 128, the gate insulating film 138 provided over the gate layer 136d, the oxide semiconductor layer 140 which is provided over the gate insulating film 138 so as to overlap with the gate layer 136d, and the source layer 142a and the drain layer 142b which are provided in contact with the upper surface of the oxide semiconductor layer 140.

Note that also in the structures in FIGS. 9A and 9B, a component is sometimes omitted from the structure in FIG. 3 and the like. Also in this case, an effect such as simplification of fabricating steps can be obtained.

Figure 10A:
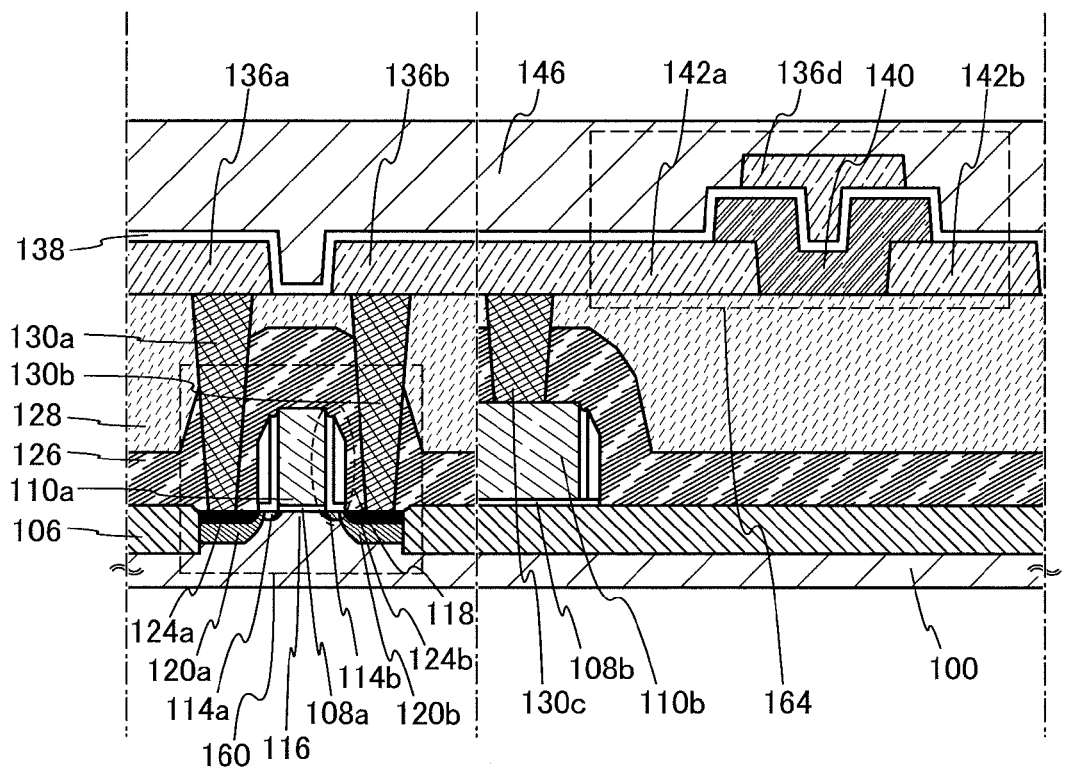
FIGS. 10A and 10B each illustrate an example of a transistor.
Figure 10B:
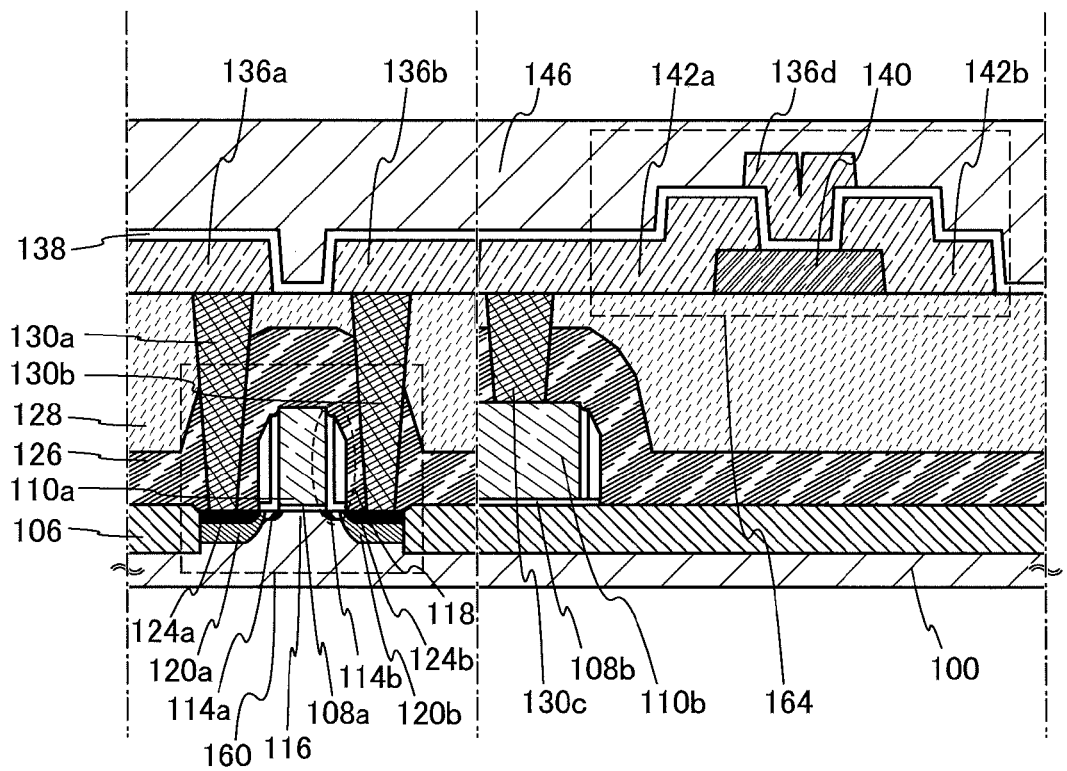

FIGS. 10A and 10B each illustrate the transistor 164 in the case where the size of the element is relatively large and the gate layer 136d is placed over the oxide semiconductor layer 140. Also in this case, a demand for the planarity of a surface and the coverage is relatively moderate, so that it is not necessary to form a wiring, an electrode, and the like to be embedded in an insulating layer. For example, the gate layer 136d and the like can be formed by patterning after formation of a conductive layer.

A big difference between the structure in FIG. 10A and the structure in FIG. 10B is that the source layer 142a and the drain layer 142b are in contact with either the bottom surface or the upper surface of the oxide semiconductor layer 140. Moreover, these differences result in a different arrangement of other electrode layers, an insulating layer, and the like. Note that the details of each component are the same as those of FIG. 3, and the like.

Specifically, the transistor 164 illustrated in FIG. 10A includes the source layer 142a and the drain layer 142b provided over the interlayer insulating layer 128; the oxide semiconductor layer 140 in contact with the upper surfaces of the source layer 142a and the drain layer 142b; the gate insulating film 138 provided over the source layer 142a, the drain layer 142b, and the oxide semiconductor layer 140; and the gate layer 136d provided over the gate insulating film 138 and in a region overlapping with the oxide semiconductor layer 140.

The transistor 164 illustrated in FIG. 10B includes the oxide semiconductor layer 140 provided over the interlayer insulating layer 128; the source layer 142a and the drain layer 142b provided to be in contact with the upper surface of the oxide semiconductor layer 140; the gate insulating film 138 provided over the source layer 142a, the drain layer 142b, and the oxide semiconductor layer 140; and the gate layer 136d provided over the gate insulating film 138. Note that the gate layer 136d is provided in a region overlapping with the oxide semiconductor layer 140 with the gate insulating film 138 interposed therebetween.

Note that also in the structures in FIGS. 10A and 10B, a component is sometimes omitted from the structure in FIG. 3 and the like. Also in this case, an effect such as simplification of fabricating steps can be obtained.

In this embodiment, the example in which the transistor 164 is formed over the transistor 160 is described; however, the structures of the transistor 160 and the transistor 164 are not limited to the above. For example, the transistor 160 and the transistor 164 can be formed over the same planar surface. Further, the transistor 160 and the transistor 164 may be provided to overlap with each other.

Note that this embodiment or part of this embodiment can be freely combined with the other embodiments or part of the other embodiments.

Embodiment 4

Figure 11:
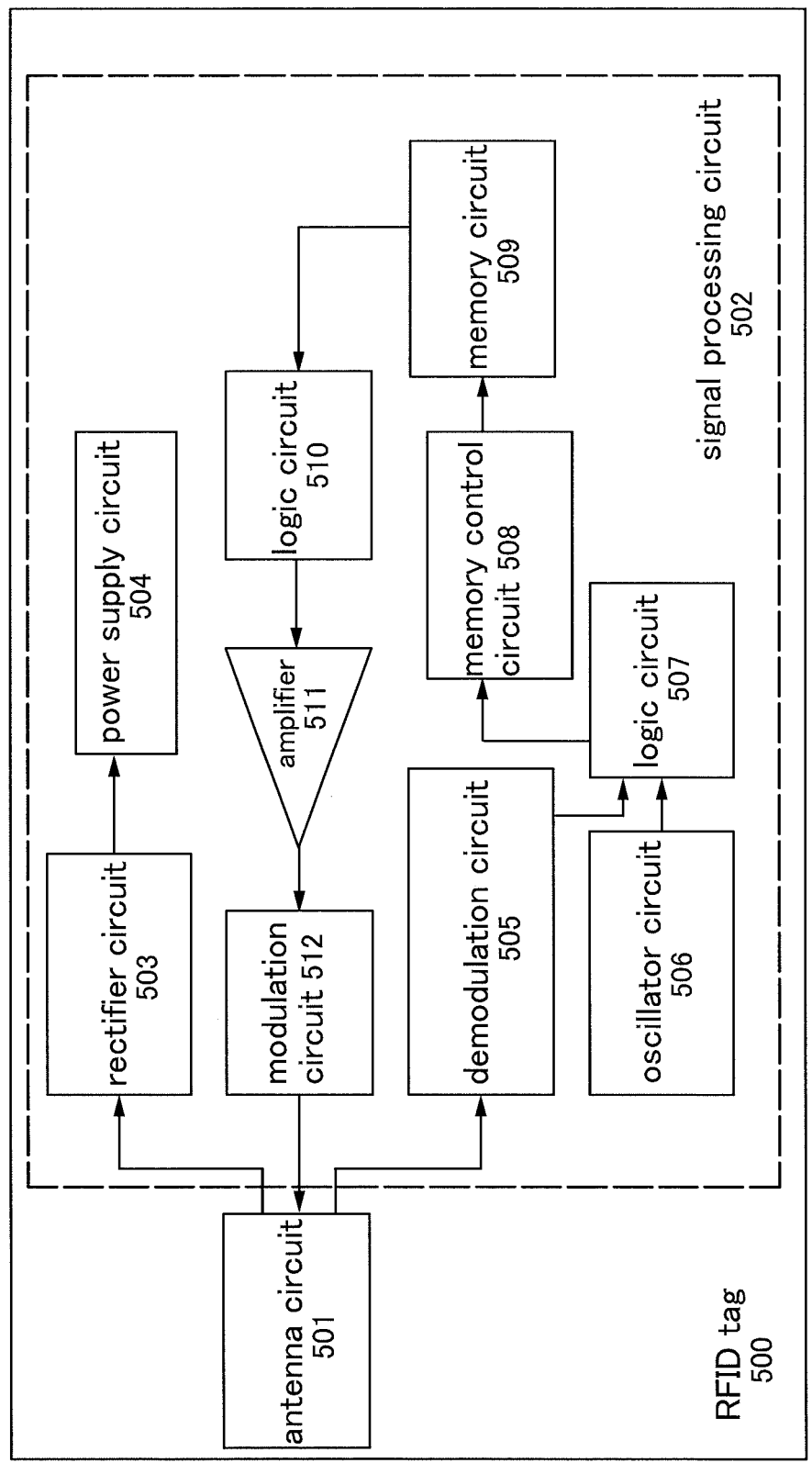
FIG. 11 illustrates an application example of a semiconductor device.

In this embodiment, a radio frequency identification (RFID) tag 500 will be described as an application example of the semiconductor devices having a storage device, which are described in the above embodiments (see FIG. 11).

The RFID tag 500 includes an antenna circuit 501 and a signal processing circuit 502. The signal processing circuit 502 includes a rectifier circuit 503, a power supply circuit 504, a demodulation circuit 505, an oscillator circuit 506, a logic circuit 507, a memory control circuit 508, a memory circuit 509, a logic circuit 510, an amplifier 511, and a modulation circuit 512. The memory circuit 509 includes any of the semiconductor devices described in the above embodiments.

Communication signals received by the antenna circuit 501 are input into the demodulation circuit 505. The frequency of the communication signals received, that is, signals transmitted and received between the antenna circuit 501 and a reader/writer can be, UHF (ultra high frequency) bands including 915 MHz, 2.45 GHz, and the like that are determined on the basis of the ISO standards or the like. Needless to say, the frequency of signals transmitted and received between the antenna circuit 501 and the reader/writer is not limited to this, and for example, any of the following frequencies can be used: 300 GHz to 3 THz which is a submillimeter wave, 30 GHz to 300 GHz which is a millimeter wave, 3 GHz to 30 GHz which is a microwave, 300 MHz to 3 GHz which is an ultra high frequency, and 30 MHz to 300 MHz which is a very high frequency. In addition, signals transmitted and received between the antenna circuit 501 and the reader/writer are signals obtained through carrier modulation. A carrier wave is modulated by analog modulation or digital modulation, and any of amplitude modulation, phase modulation, frequency modulation, and spread spectrum may be used. Preferably, amplitude modulation or frequency modulation is used.

An oscillation signal output from the oscillator circuit 506 is supplied as a clock signal to the logic circuit 507. In addition, the modulated carrier wave is demodulated in the demodulation circuit 505. The demodulated signal is transmitted to the logic circuit 507 and analyzed. The signal analyzed in the logic circuit 507 is transmitted to the memory control circuit 508. The memory control circuit 508 controls the memory circuit 509, takes out data stored in the memory circuit 509, and transmits the data to the logic circuit 510. The data is encoded in the logic circuit 510. Then, the data which is encoded is amplified in the amplifier 511. Based on the amplified data, the modulation circuit 512 modulates carrier waves. In accordance with the modulated carrier wave, the reader/writer recognizes the signal from the RFID tag 500.

Carrier waves input to the rectifier circuit 503 are rectified and then input to the power supply circuit 504. Power supply voltage obtained in this manner is supplied by the power supply circuit 504 to the demodulation circuit 505, the oscillator circuit 506, the logic circuit 507, the memory control circuit 508, the memory circuit 509, the logic circuit 510, the amplifier 511, the modulation circuit 512, and the like.

A connection between the signal processing circuit 502 and an antenna in the antenna circuit 501 is not specifically limited. For example, the antenna and the signal processing circuit 502 are connected by wire bonding or bump connection. Alternatively, the signal processing circuit 502 is formed to have a chip shape and one surface thereof is used as an electrode and attached to the antenna. The signal processing circuit 502 and the antenna can be attached to each other by the use of an anisotropic conductive film (ACF).

The antenna is either formed over the same substrate as the signal processing circuit 502, or formed as an external antenna. Needless to say, the antenna is provided on the above or below of the signal processing circuit.

The rectifier circuit 503 converts AC signals that are induced by carrier waves received by the antenna circuit 501 into DC signals.

Figure 12:
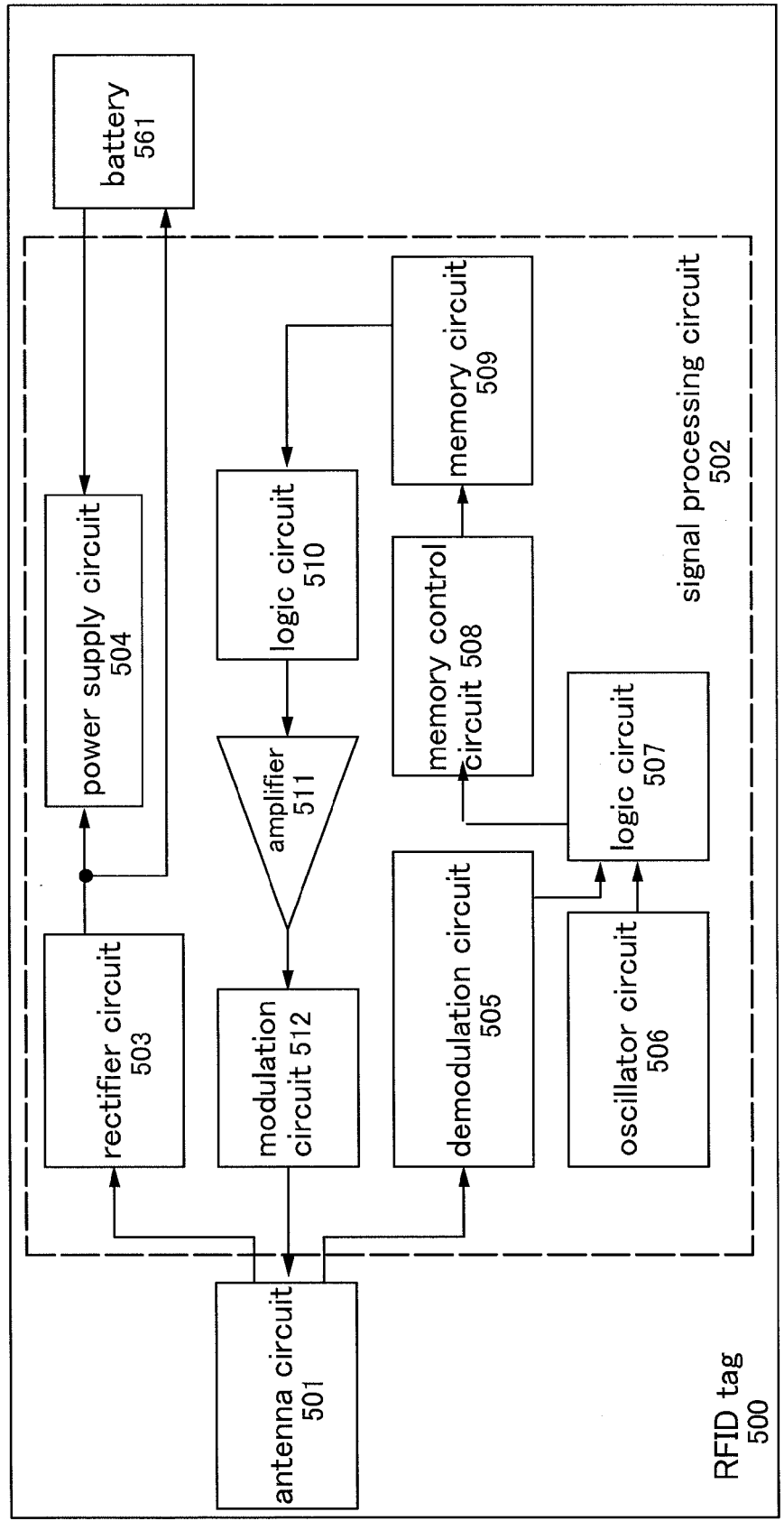
FIG. 12 illustrates an application example of a semiconductor device.
Figure 13A:
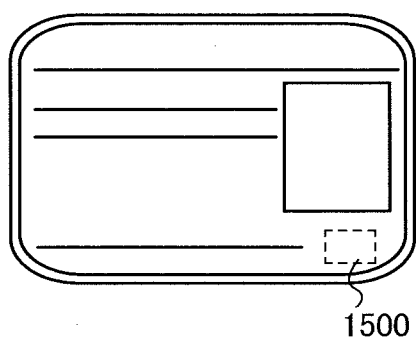
FIGS. 13A to 13F each illustrate an application example of a semiconductor device.
Figure 13B:
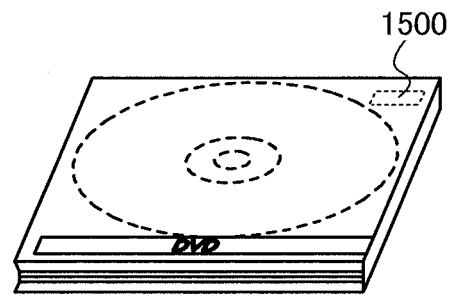
Figure 13C:
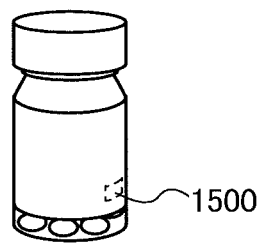
Figure 13D:
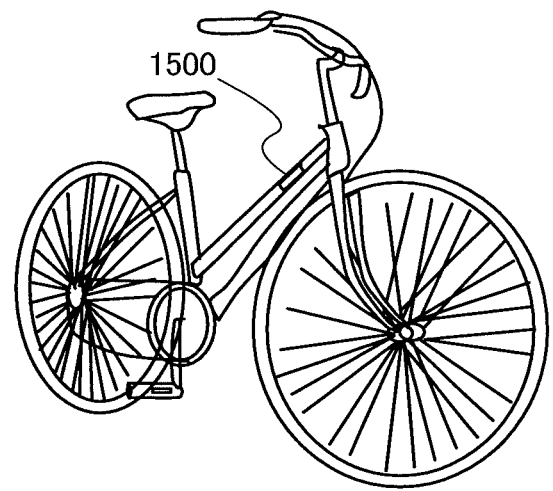
Figure 13E:
Figure 13F:
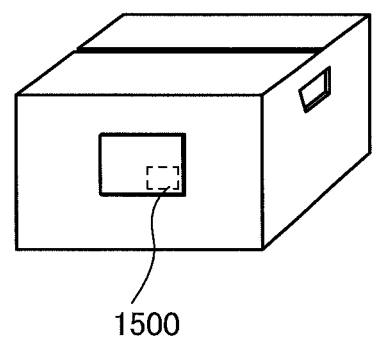

The RFID tag 500 may include a battery 561 (see FIG. 12). When power supply voltage output from the rectifier circuit 503 is not high enough to operate the signal processing circuit 502, the battery 561 also supplies power supply voltage to each of the circuits included in the signal processing circuit 502 (the circuits such as the demodulation circuit 505, the oscillator circuit 506, the logic circuit 507, the memory control circuit 508, the memory circuit 509, the logic circuit 510, the amplifier 511, and the modulation circuit 512).

Surplus voltage of the power supply voltage output from the rectifier circuit 503 may be stored in the battery 561. When an antenna circuit and a rectifier circuit are provided in the RFID tag 500 in addition to the antenna circuit 501 and the rectifier circuit 503, energy stored in the battery 561 can be obtained from electromagnetic waves and the like that are generated randomly.

A battery can be continuously used by charging. As the battery, a battery formed into a sheet form is used. For example, by using a lithium polymer battery that includes a gel electrolyte, a lithium ion battery, a lithium secondary battery, or the like, a reduction in the size of the battery can be realized. For example, a nickel metal hydride battery, a nickel cadmium battery, a capacitor having large capacitance, and the like can be given.

Embodiment 5

In this embodiment, application examples of the semiconductor devices described in the above embodiments will be described with reference to FIGS. 13A to 13F.

As illustrated in FIGS. 13A to 13F, the semiconductor device is widely used by being provided in, for example, bills, coins, securities, bearer bonds, documents (such as driver's licenses or resident's cards, see FIG. 13A), storage media (such as DVD software or video tapes, see FIG. 13B), packaging containers (such as wrapping paper or bottles, see FIG. 13C), vehicles (such as bicycles, see FIG. 13D), personal belongings (such as bags or pairs of glasses), foods, plants, animals, human bodies, clothes, commodities or products such as electronic devices (liquid crystal display devices, EL display devices, television receivers, or mobile phones), tags on products (see FIGS. 13E and 13F), or the like.

A semiconductor device 1500 is fixed to a product by being mounted on a printed board, attached to a surface of the product, or embedded in the product. For example, the semiconductor device 1500 is incorporated in paper of a book or an organic resin package to be fixed to each object. As for the semiconductor device 1500, a small size, thin, and light weight are achieved; thus, the design of an object is not impaired even after the semiconductor device 1500 is fixed to the object. Further, by providing the semiconductor device 1500 for bills, coins, securities, bearer bonds, documents, and the like, an identification function can be obtained and forgery thereof can be prevented by utilizing the identification function. Further, when the semiconductor device of the present invention is attached to packaging containers, storage media, personal belongings, foods, clothes, commodities, electronic devices, or the like, a system such as an inspection system can be efficiently used. In addition, even for a vehicle, the level of security against theft or the like can be raised when the semiconductor device 1500 is attached to the vehicle.

When a semiconductor device described in the above embodiments is used for application usage given in this embodiment in this manner, data which is used for exchanging information can be maintained at an accurate value. Therefore, authenticity or security of an object can be improved.

This application is based on Japanese Patent Application serial no. 2010-115852 filed with the Japan Patent Office on May 20, 2010, the entire contents of which are hereby incorporated by reference.

What is claimed is:

1. A driving method of a semiconductor device comprising the steps of:
in a writing period, applying a first potential to a gate of a first transistor, turning on the first transistor, and accumulating a positive electric charge in a node through the first transistor, wherein the node electrically is connected to one of a source and a drain of the first transistor;
in an inverted period following the writing period, applying a second potential to the gate of the first transistor, and turning off the first transistor, wherein the second potential is a negative potential; and
in a retention period following the inverted period, applying a third potential to the gate of the first transistor, maintaining an off state of the first transistor, and retaining positive electric charge accumulated in the node, wherein the third potential is lower than the first potential and higher than the second potential,
wherein a channel region of the first transistor is comprised in an oxide semiconductor layer.

2. The driving method of a semiconductor device, according to claim 1, wherein a part of the positive electric charge accumulated in the node in the writing period is trapped in the oxide semiconductor layer or at an interface between the oxide semiconductor layer and a gate insulating film by applying the second potential to the gate of the first transistor in the inverted period.

3. The driving method of a semiconductor device, according to claim 1, wherein multilevel data is determined in accordance with an amount of the positive electric charge retained in the node.

4. The driving method of a semiconductor device, according to claim 1, wherein the node is connected to a gate of a second transistor.

5. A driving method of a semiconductor device comprising the steps of:
in a first period, applying a first potential to a first electrode of a first transistor comprising oxide semiconductor layer, turning on the first transistor, and accumulating a positive electric charge in a region through the first transistor, wherein the region is connected to a second electrode of the first transistor;
in a second period following the first period, applying a second potential to the first electrode, and turning off the first transistor, wherein the second potential is a negative potential; and
in a third period following the second period, applying a third potential to the first electrode, maintaining an off state of the first transistor, and retaining positive electric charge accumulated in the region, wherein the third potential is lower than the first potential and higher than the second potential,
wherein the oxide semiconductor layer is adjacent to the first electrode with an insulating film interposed therebetween.

6. The driving method of a semiconductor device, according to claim 5, wherein a part of the positive electric charge accumulated in the region in the first period is trapped in the oxide semiconductor layer or at an interface between the oxide semiconductor layer and the insulating film by applying the second potential to the first electrode of the first transistor in the second period.

7. The driving method of a semiconductor device, according to claim 5, wherein multilevel data is determined in accordance with an amount of the positive electric charge retained in the region.

8. The driving method of a semiconductor device, according to claim 5, wherein the region is connected to a gate of a second transistor.

* * * * *